United States Patent
Chung et al.

(10) Patent No.: US 11,956,965 B2
(45) Date of Patent: Apr. 9, 2024

(54) MEMORY DEVICE AND ELECTRONIC SYSTEM INCLUDING THE SAME

(71) Applicant: SAMSUNG ELECTRONICS CO., LTD., Suwon-si (KR)

(72) Inventors: Giyong Chung, Seoul (KR); Jaehyung Kim, Seoul (KR)

(73) Assignee: Samsung Electronics Co., Ltd. (KR)

( * ) Notice: Subject to any disclaimer, the term of this patent is extended or adjusted under 35 U.S.C. 154(b) by 309 days.

(21) Appl. No.: 17/212,029

(22) Filed: Mar. 25, 2021

(65) Prior Publication Data

US 2022/0085037 A1 Mar. 17, 2022

(30) Foreign Application Priority Data

Sep. 16, 2020 (KR) .......... 10-2020-0119098

(51) Int. Cl.
*H10B 43/35* (2023.01)
*H10B 41/27* (2023.01)
*H10B 41/35* (2023.01)
*H10B 41/41* (2023.01)
*H10B 43/27* (2023.01)
*H10B 43/40* (2023.01)

(52) U.S. Cl.
CPC ............. *H10B 43/35* (2023.02); *H10B 41/27* (2023.02); *H10B 41/35* (2023.02); *H10B 41/41* (2023.02); *H10B 43/27* (2023.02); *H10B 43/40* (2023.02)

(58) Field of Classification Search
CPC ........ H10B 43/35; H10B 41/27; H10B 41/35; H10B 41/41; H10B 43/27; H10B 43/40; H10B 43/10; H01L 23/5286
See application file for complete search history.

(56) References Cited

U.S. PATENT DOCUMENTS

| | | | |
|---|---|---|---|
| 8,030,700 B2 | 10/2011 | Sakamoto | |
| 9,583,503 B1 | 2/2017 | Lee | |
| 10,381,362 B1* | 8/2019 | Cui | ............... H01L 23/5226 |
| 10,559,583 B2 | 2/2020 | Park et al. | |
| 2017/0301684 A1 | 10/2017 | Park et al. | |
| 2019/0296031 A1 | 9/2019 | Murata et al. | |
| 2019/0312049 A1 | 10/2019 | Cheon et al. | |
| 2020/0020702 A1 | 1/2020 | Baek | |
| 2021/0217769 A1* | 7/2021 | Lee | ..................... G11C 7/18 |

* cited by examiner

*Primary Examiner* — Fernando L Toledo
*Assistant Examiner* — Jahae Kim
(74) *Attorney, Agent, or Firm* — Fish & Richardson P.C.

(57) ABSTRACT

A memory device and an electronic system, the memory device including a substrate; a ground selection line on the substrate, a cutting portion cutting the ground selection line; a first insulation layer and a first word line stacked immediately above the ground selection line; and second insulation layers and second word lines alternately stacked on the first word line, wherein the first word line includes a first portion laterally offset from the cutting portion and a second portion overlying the cutting portion, the first portion of the first word line has a first thickness, and the second portion of the first word line has a second thickness less than the first thickness.

17 Claims, 37 Drawing Sheets

MEMORY DEVICE AND ELECTRONIC SYSTEM INCLUDING THE SAME

CROSS-REFERENCE TO RELATED APPLICATION

Korean Patent Application No. 10-2020-0119098, filed on Sep. 16, 2020 in the Korean Intellectual Property Office, and entitled: "Memory Device and Electronic System Including the Same," is incorporated by reference herein in its entirety.

BACKGROUND

1. Field

Embodiments relate to a memory device and an electronic system including the same.

2. Description of the Related Art

In an electronic system for data storage, a semiconductor device capable of storing high-capacity data may be used. For integration of the semiconductor device, a vertical non-volatile memory device in which memory cells are stacked in a vertical direction may be considered.

SUMMARY

The embodiments may be realized by providing a memory device including a substrate; a ground selection line on the substrate, a cutting portion cutting the ground selection line; a first insulation layer and a first word line stacked immediately above the ground selection line; and second insulation layers and second word lines alternately stacked on the first word line, wherein the first word line includes a first portion laterally offset from the cutting portion and a second portion overlying the cutting portion, the first portion of the first word line has a first thickness, and the second portion of the first word line has a second thickness less than the first thickness.

The embodiments may be realized by providing a memory device including a substrate; a circuit pattern on the substrate; a base semiconductor pattern on the circuit pattern; a ground selection line on the base semiconductor pattern, a cutting portion cutting the ground selection line; a first insulation layer and a first word line stacked immediately above the ground selection line; a lower insulation pattern passing through a portion of the first insulation layer and the cutting portion; second insulation layers and second word lines alternately stacked on the first word line; and a channel structure passing through the ground selection line, the first insulation layer, the first word line, the second insulation layers, and the second word lines, the channel structure extending in a vertical direction, wherein the first word line includes a first portion laterally offset from the cutting portion and a second portion overlying the cutting portion, the first portion of the first word line has a first thickness, the second portion of the first word line has a second thickness less than the first thickness, and an upper surface of the lower insulation pattern protrudes above a lower surface of the first word line at the first portion of the first word line.

The embodiments may be realized by providing an electronic system including a memory device; and a controller configured to control the memory device, the controller being electrically connected to the memory device through an input/output pad of the memory device, wherein the memory device includes a substrate; a peripheral circuit pattern on the substrate; a ground selection line on the substrate, a cutting portion cutting the ground selection line; a first insulation layer and a first word line stacked immediately above the ground selection line; second insulation layers and second word lines alternately stacked on the first word line; and the input/output pad, the input/output pad being electrically connected to the peripheral circuit pattern, wherein the first word line includes a first portion laterally offset from the cutting portion and a second portion overlying the cutting portion, wherein the first portion of the first word line has a first thickness, and wherein the second portion of the first word line has a second thickness less than the first thickness.

BRIEF DESCRIPTION OF THE DRAWINGS

Features will be apparent to those of skill in the art by describing in detail exemplary embodiments with reference to the attached drawings in which.

DETAILED DESCRIPTION

Figure 1:
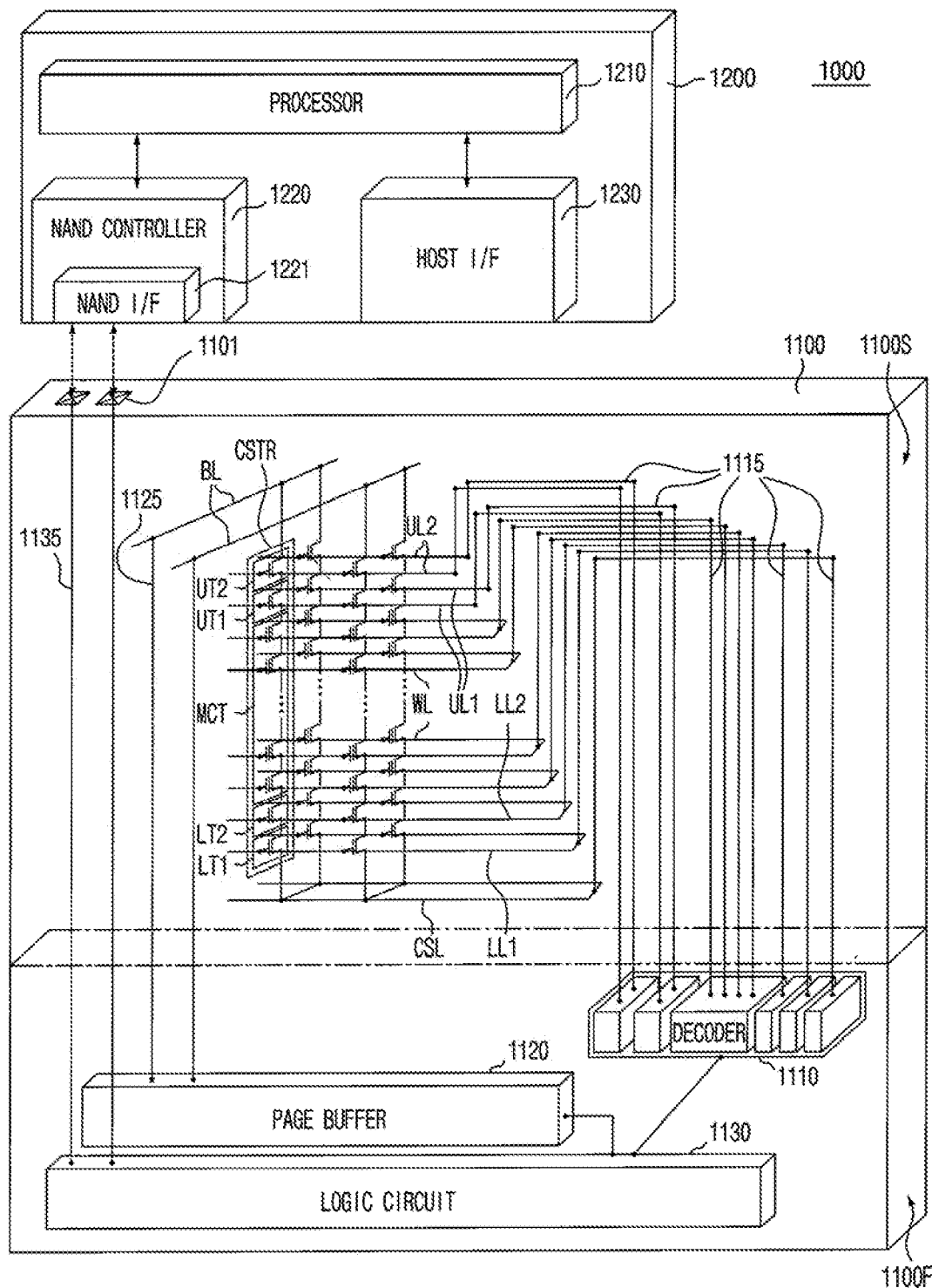
FIG. 1 is a diagram of an electronic system including a semiconductor device in accordance with example embodiments.

FIG. 1 is a diagram of an electronic system including a semiconductor device in accordance with example embodiments.

Referring to FIG. 1, an electronic system 1000 in accordance with example embodiments may include a semiconductor device 1100 and a controller 1200 electrically connected to the semiconductor device 1100. The electronic system 1000 may be a storage device including one or more semiconductor devices 1100 or an electronic device including a storage device. In an implementation, the electronic system 1000 may be a solid state drive device (SSD), a universal serial bus (USB) device, a computing system, a medical device, or a communication device, which are include one or more semiconductor devices 1100.

The semiconductor device 1100 may be a non-volatile memory device. In an implementation, the semiconductor device 1100 may be one of the NAND flash memory devices illustrated with reference to FIGS. 5 to 38.

The semiconductor device 1100 may include a first structure 1100F and a second structure 1100S on the first structure 1100F. In an implementation, the first structure 1100F may be beside of (e.g., laterally adjacent to) the second structure 1100S. The first structure 1100F may be a peripheral circuit structure including a decoder circuit 1110, a page buffer 1120, and a logic circuit 1130. The second structure 1100S may include a bit line BL, a common source line CSL, a word lines WL, first and second gate upper lines UL1 and UL2, and first and second gate lower lines LL1 and LL2, and memory cell strings CSTR between the bit line BL and the common source line CSL. The second structure 1100S may serve as a memory cell structure.

In the second structure 1100S, each of the memory cell strings CSTR may include lower transistors LT1 and LT2 adjacent to the common source line CSL, upper transistors UT1 and UT2 adjacent to the bit line BL, and a plurality of memory cell transistors MCT disposed between the lower transistors LT1 and LT2 and the upper transistors UT1 and UT2. The number of lower transistors LT1 and LT2 and the number of upper transistors UT1 and UT2 may be variously modified in accordance with embodiments.

In an implementation, the upper transistors UT1 and UT2 may include a string select transistor, and the lower transistors LT1 and LT2 may include a ground selection transistor. Gate lower lines LL1 and LL2 may be gate electrodes of lower transistors LT1 and LT2, respectively. The word lines WL may be gate electrodes of the memory cell transistors MCT, and the gate upper lines UL1 and UL2 may be gate electrodes of the upper transistors UT1 and UT2, respectively.

In an implementation, the lower transistors LT1 and LT2 may include a lower erase control transistor LT1 and a ground selection transistor LT2 connected in series. The upper transistors UT1 and UT2 may include a string select transistor UT1 and an upper erase control transistor UT2 connected in series. At least one of the lower erase control transistor LT1 and the upper erase control transistor UT1 may erase data stored in the memory cell transistors MCT, and the data may be erased by using a gate induced leakage current (GIDL).

The common source line CSL, the first and second gate lower lines LL1 and LL2, the word lines WL, and the first and second gate upper lines UL1 and UL2 may be electrically connected to the decoder circuit 1110 by a first connection wiring 1115 extending to the second structure 1100S from the first structure 1100F. The bit lines BL may be electrically connected to the page buffer 1120 by a second connection wiring 1125 extending from the first structure 1100F to the second structure 1100S.

In the first structure 1100F, the decoder circuit 1110 and the page buffer 1120 may control at least one selected memory cell transistor among the plurality of memory cell transistors MCT. The decoder circuit 1110 and the page buffer 1120 may be controlled by the logic circuit 1130. The semiconductor device 1100 may communicate with the controller 1200 by an input/output pad 1101 electrically connected to the logic circuit 1130. The input/output pad 1101 may be electrically connected to the logic circuit 1130 by an input/output connection wiring 1135 extending from the first structure 1100F to the second structure 1100S.

The controller 1200 may include a processor 1210, a NAND controller 1220, and a host interface 1230. In an implementation, the electronic system 1000 may include a plurality of semiconductor devices 1100. In this case, the controller 1200 may control the plurality of semiconductor devices 1000.

The processor 1210 may control an overall operation of the electronic system 1000 including the controller 1200. The processor 1210 may operate according to a firmware. The processor 1210 may control the NAND controller 1220 so that the semiconductor device 1100 may be accessed. The NAND controller 1220 may include a NAND interface 1221 for communication with the semiconductor device 1100. A control command for controlling the semiconductor device 1100, data for writing in the memory cell transistors MCT of the semiconductor device 1100, and data for reading from the memory cell transistors MCT of the semiconductor device 1100 may be transmitted by the NAND interface 1221. The host interface 1230 may communicate between the electronic system 1000 and an external host. When the control command is received from the external host by the host interface 1230, the processor 1210 may control the semiconductor device 1100 in response to the control command.

Figure 2:
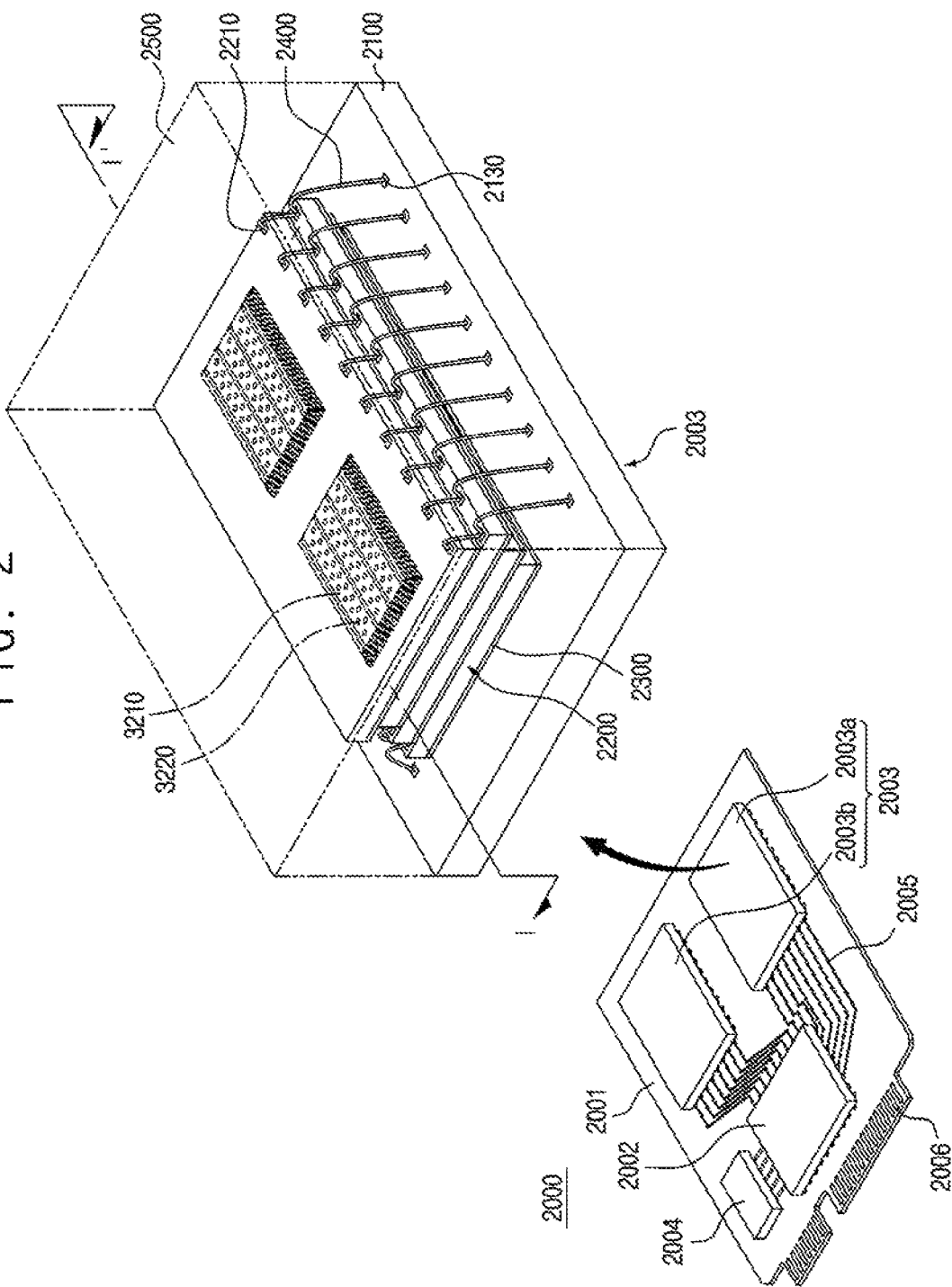
FIG. 2 is a perspective view of an electronic system including a semiconductor device in accordance with example embodiments.

FIG. 2 is a perspective view of an electronic system including a semiconductor device in accordance with example embodiments.

Referring to FIG. 2, an electronic system 2000 in accordance with example embodiments may include a main substrate 2001, a controller 2002 mounted on the main substrate 2001, one or more semiconductor packages 2003, and a DRAM 2004. The semiconductor package 2003 and the DRAM 2004 may be connected to the controller 2002 by wiring patterns 2005 on the main substrate 2001.

The main substrate 2001 may include a connector 2006 (including a plurality of pins) to be coupled to an external host. The number and arrangement of the plurality of pins in the connector 2006 may be controlled according to a communication interface between the electronic system 2000 and the external host. In an implementation, the electronic system 2000 may be communicated with the external host by one of interfaces including a Universal Serial Bus (USB), a Peripheral Component Interconnect Express (PCI-Express), a Serial Advanced Technology Attachment (SATA), an M-Phy for Universal Flash Storage (UFS), or the like. In an implementation, the electronic system 2000 may be operated by power supplied from the external host through the connector 2006. The electronic system 2000 may further include a Power Management Integrated Circuit (PMIC) for distributing the power supplied from the external host to the controller 2002 and the semiconductor package 2003.

The controller 2002 may write data in the semiconductor package 2003 or read data from the semiconductor package 2003. An operation speed of the electronic system 2000 may be improved by the controller 2002.

The DRAM 2004 may be a buffer memory for reducing a difference between a speed of the semiconductor package 2003 for storing data and a speed of the external host. The DRAM 2004 included in the electronic system 2000 may also operate as a type of a cache memory, and the DRAM 2004 may provide a space for temporarily storing data in a control operation of the semiconductor package 2003. When the DRAM 2004 is included in the electronic system 2000, the controller 2002 may include a DRAM controller for controlling the DRAM 2004 and a NAND controller for controlling the semiconductor package 2003.

The semiconductor package 2003 may include first and second semiconductor packages 2003a and 2003b spaced apart from each other. Each of the first and second semiconductor packages 2003a and 2003b may be a semiconductor package including a plurality of semiconductor chips 2200. Each of the first and second semiconductor packages 2003a and 2003b may include a package substrate 2100, semiconductor chips 2200 on the package substrate 2100, and adhesion layers 2300 on a lower surface of each of the semiconductor chips 2200, a connection structure 2400 electrically connected to the semiconductor chips 2200 and the package substrate 2100, and a molding layer 2500 on the package substrate 2100 to cover the semiconductor chips 2200 and the connection structure 2400.

The package substrate 2100 may be a printed circuit board including package upper pads 2130. Each of semiconductor chips 2200 may include an input/output pad 2210. The input/output pad 2210 may correspond to the input/output pad 1101 of FIG. 1. Each of the semiconductor chips 2200 may include cell stacked structures 3210 and channel structures 3220. Each of the semiconductor chips 2200 may include, e.g., one of the NAND flash memory devices illustrated with reference to FIGS. 5 to 38.

In an implementation, the connection structure 2400 may be a bonding wire electrically connecting with the input/output pad 2210 and the package upper pads 2130. In an implementation, in each of the first and second semiconductor packages 2003a and 2003b, the semiconductor chips 2200 may be electrically connected to each other by the bonding wire. The semiconductor chips 2200 may be electrically connected to the package upper pads 2130 on the package substrate 2100. In an implementation, in each of the first and second semiconductor packages 2003a and 2003b, the semiconductor chips 2200 electrically connected to each other by connection structures 2400a including through silicon vias (TSV), instead of the bonding wiring.

In an implementation, the controller 2002 and the semiconductor chips 2200 may be included in one package. In an implementation, the controller 2002 and the semiconductor chips 2200 may be mounted on a separate interposer substrate different from the main substrate 2001, and the controller 2002 and the semiconductor chips may be connected to each other by wirings formed on the interposer substrate.

Figure 3:
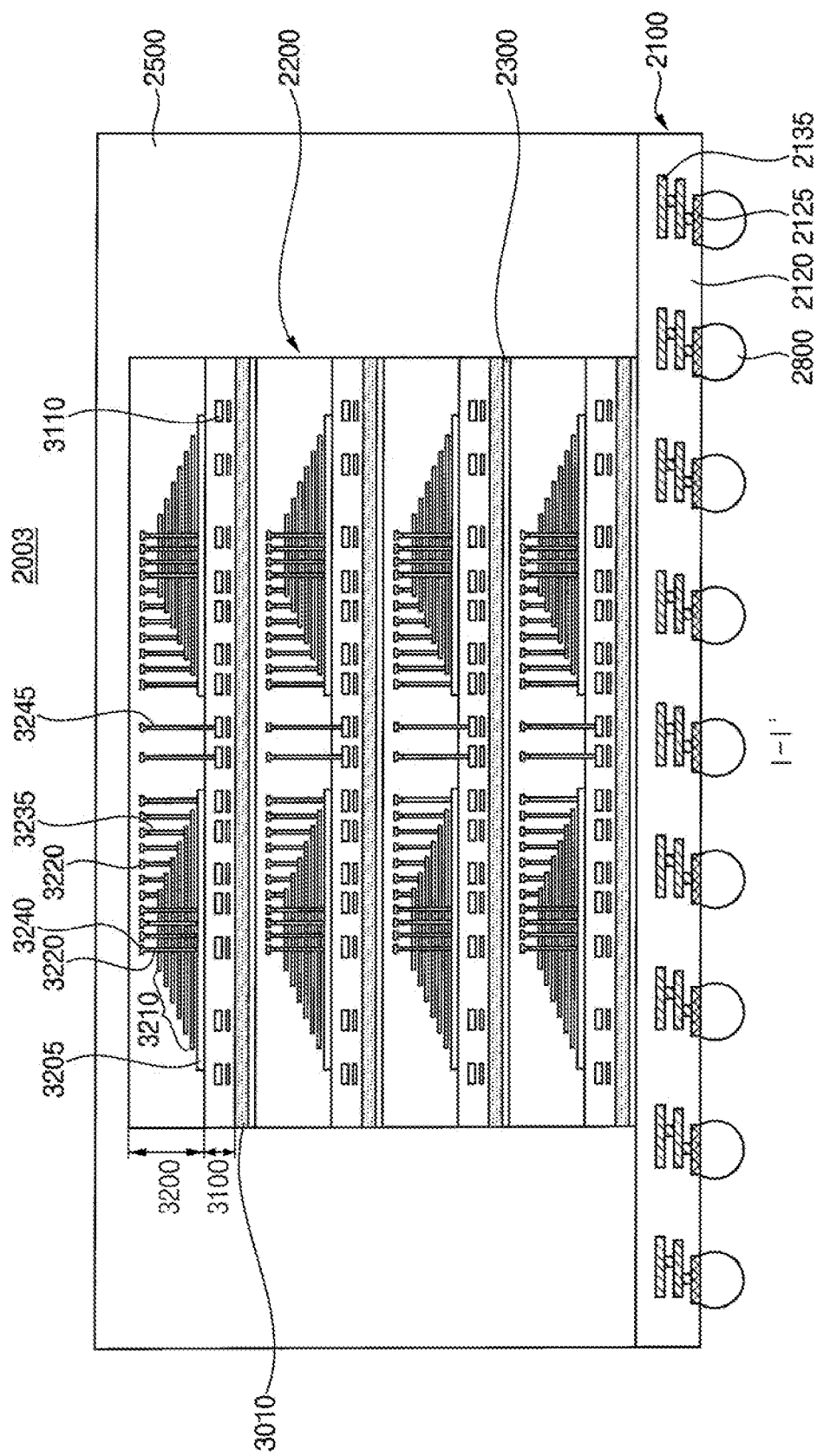
FIGS. 3 and 4 are cross-sectional views of semiconductor packages in accordance with example embodiments.
Figure 4:
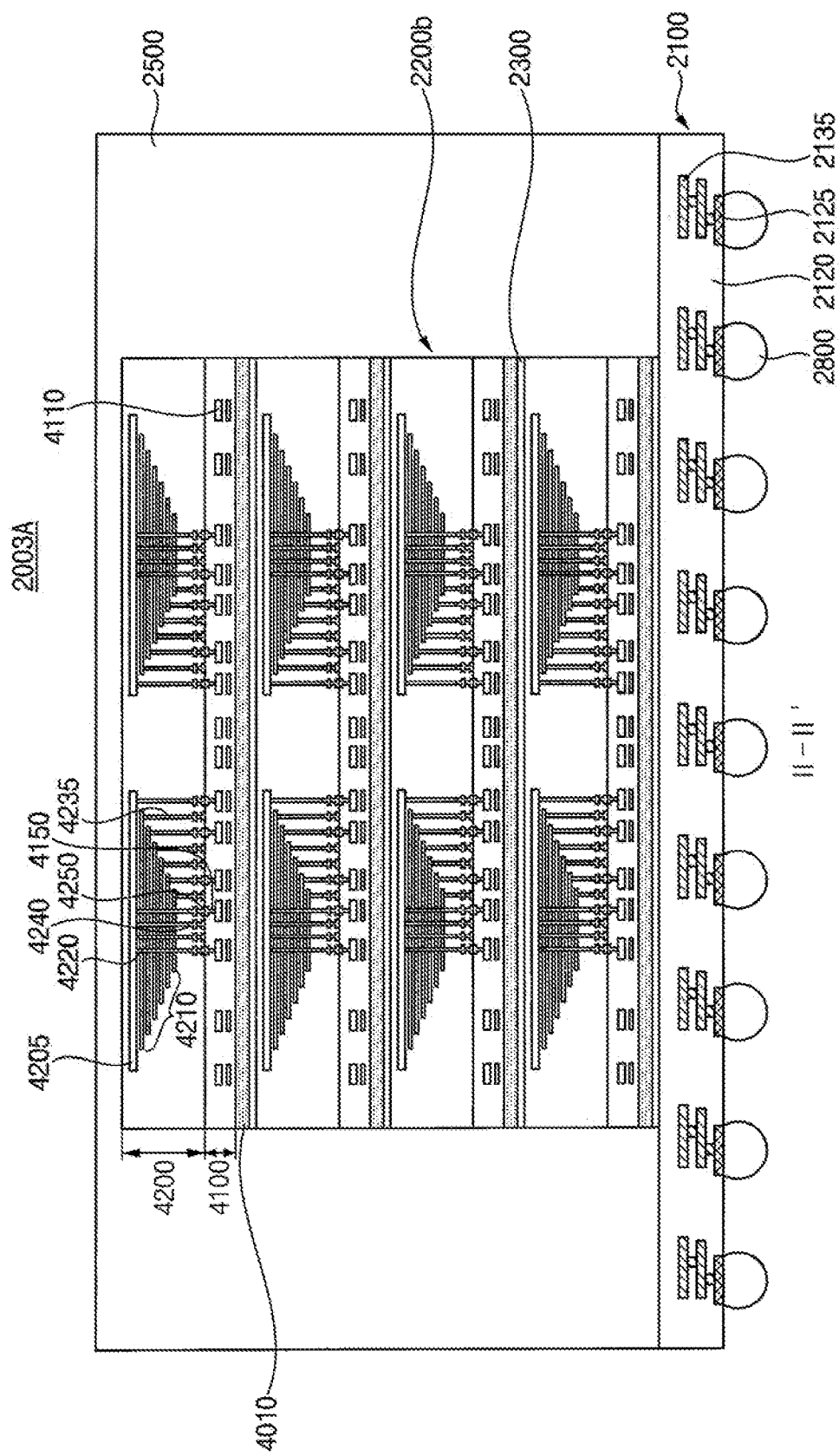

FIGS. 3 and 4 are cross-sectional views of semiconductor packages in accordance with example embodiments. Each of FIGS. 3 and 4 illustrate an example embodiment of the semiconductor package 2003 in FIG. 2. Each of FIGS. 3 and 4 conceptually show a portion cut along a cut line of I-I' of the semiconductor package 2003 in FIG. 2.

Referring to FIG. 3, in the semiconductor package 2003, the package substrate 2100 may be a printed circuit board. The package substrate 2100 may include a package substrate body part 2120, package upper pads (FIGS. 2 and 2130) on an upper surface of the package substrate body part 2120, lower pads 2125 at a lower surface of the package substrate body part 2120 or exposed through the lower surface of the package substrate body part 2120, and internal wirings 2135 for electrically connecting with the upper pads 2130 and the lower pads 2125 in an inner portion of the package substrate body part 2120. The upper pads 2130 may be electrically connected to connection structures 2400. The lower pads 2125 may be connected to wiring patterns 2005 of the main substrate 2001 in the electronic system 2000 as shown in FIG. 2 through the conductive connection parts 2800.

Each of the semiconductor chips 2200 may include a semiconductor substrate 3010 and a first structure 3100 and a second structure 3200 sequentially stacked on the semiconductor substrate 3010. The first structure 3100 may include a peripheral circuit region including peripheral wirings 3110. The second structure 3200 may include a common source line 3205, a cell stacked structure 3210 on the common source line 3205, channel structures 3220 and separation structures passing through the cell stacked structure 3210, bit lines 3240 electrically connected to the channel structures 3220, and connection wirings 3235 electrically connected to gates of the upper and lower transistors and the word lines (WL in FIG. 1) in the cell stacked structure 3210.

A gate of a ground selection transistor included in the cell stacked structure (hereinafter, a ground selection line) and a lowermost word line (e.g., a first word line) immediately above the ground selection line are shown enlarged in FIG. 29.

Figure 29:
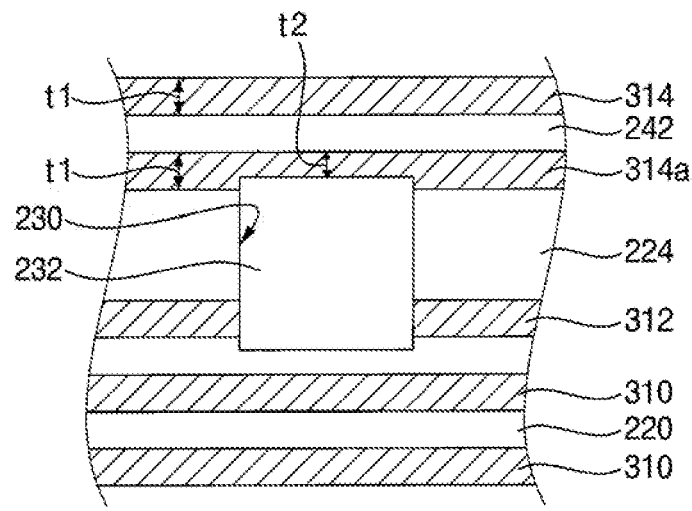
FIGS. 29 and 30 are an enlarged cross-sectional view and an enlarged cut-out perspective view of a cutting portion of a ground selection line and a portion of a first word line in the NAND flash memory device.

As shown in FIG. 29, the ground selection line 312 may have a cutting shape (i.e., cutting portion, 230) at an extended region of the semiconductor substrate. The gate and word lines above and below the cutting portion 230 of the ground selection line 312 may not have a cutting shape, but may have a connected shape. In an implementation, the first word line 314a immediately above the cutting portion 230 of the ground selection line 312 may have a first thickness t1 at a portion not facing or aligned with the cutting portion 230. A portion of the first word line 314a immediately above (e.g., aligned with) the cutting portion 230 of the ground selection line 312 may have a second thickness t2 that is less than the first thickness t1, e.g., at a portion facing the cutting portion 230. In an implementation, the first word line 314a immediately above the cutting portion 230 of the ground selection line 312 may have a cutting shape at the portion facing (e.g., aligned with or overlying) the cutting portion 230.

Each of the semiconductor chips 2200 may further include an input/output connection wiring and an input/output pad 2210. The input/output connection wiring may be electrically connected to the peripheral wirings 3110 of the first structure 3100, and may extend into the second structure 3200. The input/output pad 2210 may be electrically connected to the input/output connection wiring. Some through via contacts 3245 may be outside the cell stacked structure 3210, and some through via contacts 3245 may pass through the cell stacked structure 3210. Each of the semiconductor chips 2200 may further include the input/output pad (refer to FIG. 2, 2210) electrically connected to the peripheral wirings 3110 in the first structure 3100.

Referring to FIG. 4, in the semiconductor package 2003A, each of the semiconductor chips 2200b may include a semiconductor substrate 4010, a first structure 4100 on the semiconductor substrate 4010, and a second structure 4200 bonded on the first structure 4100. The second structure 4200 may be bonded on the first structure 4100 by a wafer bonding process.

The first structure 4100 may include a peripheral circuit region including a peripheral wiring 4110 and first bonding structures 4150. The second structure 4200 may include a common source line 4205, a cell stacked structure 4210 between the common source line 4205 and the first structure 4100, and channel structures 4220 and a separation structure passing through the cell stacked structure 4210, and second bonding structures 4250 electrically connected to the word lines (refer to FIG. 1, WL) and the channel structures 4220 of the cell stacked structure. In an implementation, the second bonding structures 4250 may be electrically connected to the channel structures 4220, the word lines (refer to FIG. 1, WL) and the gates of upper and lower transistors through the connection wirings 4235.

The ground selection line and the first word line above the ground selection line included in the cell stacked structure are shown enlarged in FIG. 29.

Each of the semiconductor chips 2200 may include a through via contact 4240 being electrically connected to the peripheral wirings 4110 in the first structure 4100 and extending into the second structure 4200.

The through via contact 4240 may pass through a dummy structure, and may be electrically connected to the peripheral wirings 4110 in the first structure 4100. Some of the through via contacts 4240 may pass through the cell stacked structure 4210.

The first bonding structures 4150 of the first structure 4100 and the second bonding structures 4250 of the second structure 4200 may be bonded to each other. A contacting portion between the first bonding structure 4150 and the second bonding structure 4250 may be formed of, e.g., copper (Cu).

Each of the semiconductor chips 2200a may further include an input/output pad (refer to FIG. 2, 2210) electrically connected to the peripheral wirings 4110 of the first structure 4100.

The semiconductor chips 2200 shown in FIG. 3 and the semiconductor chips 2200a shown in FIG. 4 may be electrically connected to each other by connection structures 2400 having a wire bonding structure. In an implementation, semiconductor chips in one semiconductor package, such as semiconductor chips 2200 shown in FIG. 3 and the semiconductor chips 2200a shown in FIG. 4, may be electrically connected to each other by connection structures 2400 including the through silicon vias.

Hereinafter, a method of manufacturing a NAND flash memory device included in the semiconductor system or semiconductor package is described.

Hereinafter, a direction horizontal to an upper surface of a substrate is referred to as a first direction, and a direction horizontal to the upper surface of the substrate and perpendicular to the first direction is referred to as a second direction. A direction perpendicular to the surface of the substrate is referred to as a vertical direction.

FIGS. 5 to 25 are views of stages in a method of manufacturing a NAND flash memory device in accordance with example embodiments.

Figure 24:
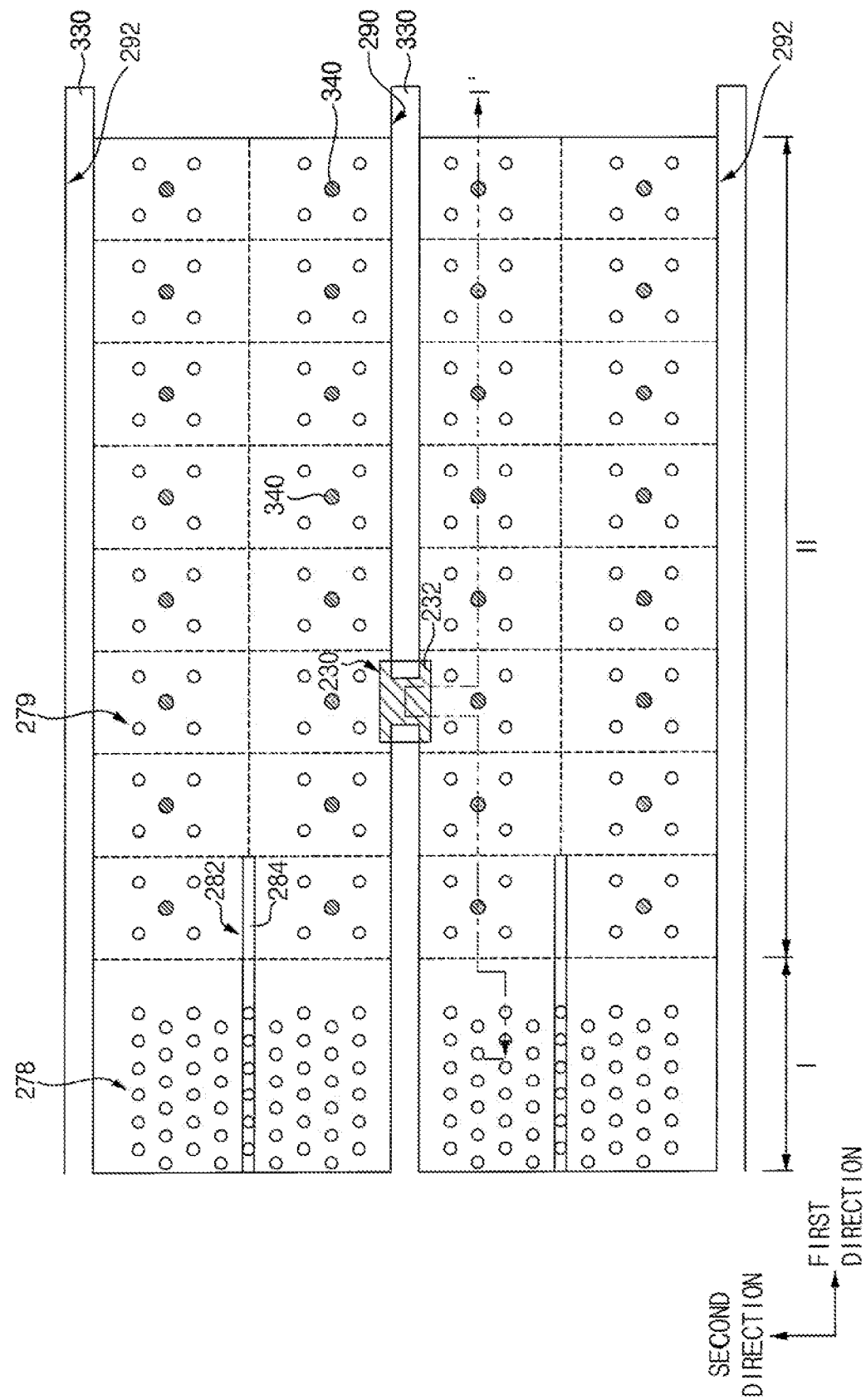

Each of the cross-sectional views is taken along a cutting line I-I' of FIG. 24.

Figure 5:
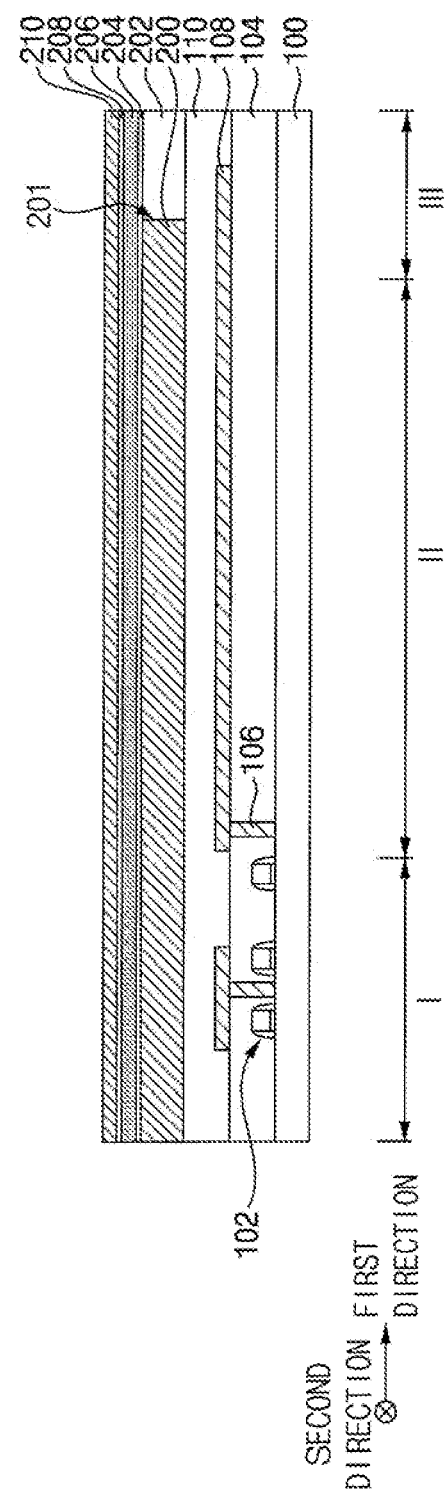
FIGS. 5 to 25 are cross-sectional views of stages in a method of manufacturing a NAND flash memory device in accordance with example embodiments.

Referring to FIG. 5, circuit patterns 102 and 106 (constituting a peripheral circuit) may be formed on a substrate 100, and a first lower insulating interlayer 104 may be formed to cover the circuit patterns 102 and 106.

The substrate 100 may include, e.g., a semiconductor material such as silicon, germanium, or silicon-germanium, or a III-V group compound such as GaP, GaAs, or GaSb. The substrate 100 may include a field region in which a device isolation pattern is formed thereon and an active region in which the device isolation pattern is not formed. As used herein, the term "or" is not an exclusive term, e.g., "A or B" would include A, B, or A and B.

The substrate 100 may include first to third regions I, II, and III. The first region I may be a cell array region in which memory cells are formed. The second region II may at least partially surround the first region I, and the second region II may be an extension region or a pad region in which contacts for transmitting electrical signals to memory cells are formed. A cell stacked structure (refer to FIGS. 23, 320) may be formed in the first and second regions I and II. The third region III may be an outer region of the cell stacked structure 320 in the first direction.

The circuit patterns may include, e.g., a lower transistor 102 and lower wirings 106.

A lower pad pattern 108 may be formed on the first lower insulating interlayer 104. A second lower insulating interlayer 110 may be formed on the first lower insulating interlayer 104 and the lower pad pattern 108.

A base semiconductor layer may be formed on the second lower insulating interlayer 110, and the base semiconductor layer may be patterned to form base semiconductor patterns 200. A first opening 201 may be formed between the base semiconductor patterns 200. In an implementation, the first opening 201 may be formed at a portion for forming through via contacts and around thereof.

A lower insulation layer may be formed on the base semiconductor pattern 200 to fill the first opening 201. The lower insulation layer may include silicon oxide. The lower insulation layer may be planarized until an upper surface of the base semiconductor pattern 200 is exposed to form a lower filling pattern 202 filling the first opening 201. The planarization process may include a chemical mechanical polishing process.

A lower sacrificial layer structure 204, 206, and 208 and a support layer 210 may be formed on the base semiconductor pattern 200 and the lower filling pattern 202. The lower sacrificial layer structure may include first to third lower sacrificial layers 204, 206, and 208 sequentially stacked. In this case, the first and third lower sacrificial layers 204 and 208 may include, e.g., an oxide such as silicon oxide, and the second lower sacrificial layer 206 may include, e.g., a nitride such as silicon nitride.

The support layer 210 may include a material having an etch selectivity with respect to the first to third lower sacrificial layers 204, 206, and 208. The support layer 210 may include, e.g., undoped polysilicon or polysilicon doped with n-type impurities. In an implementation, a portion of the support layer 210 may pass through the sacrificial layer structures 204, 206, and 208, and may contact the upper surface of the base semiconductor pattern 200.

Upper surfaces of the base semiconductor pattern 200 and the lower filling pattern 202 may be substantially flat, and thus an upper surface of the support layer 210 may be substantially flat.

Figure 6:
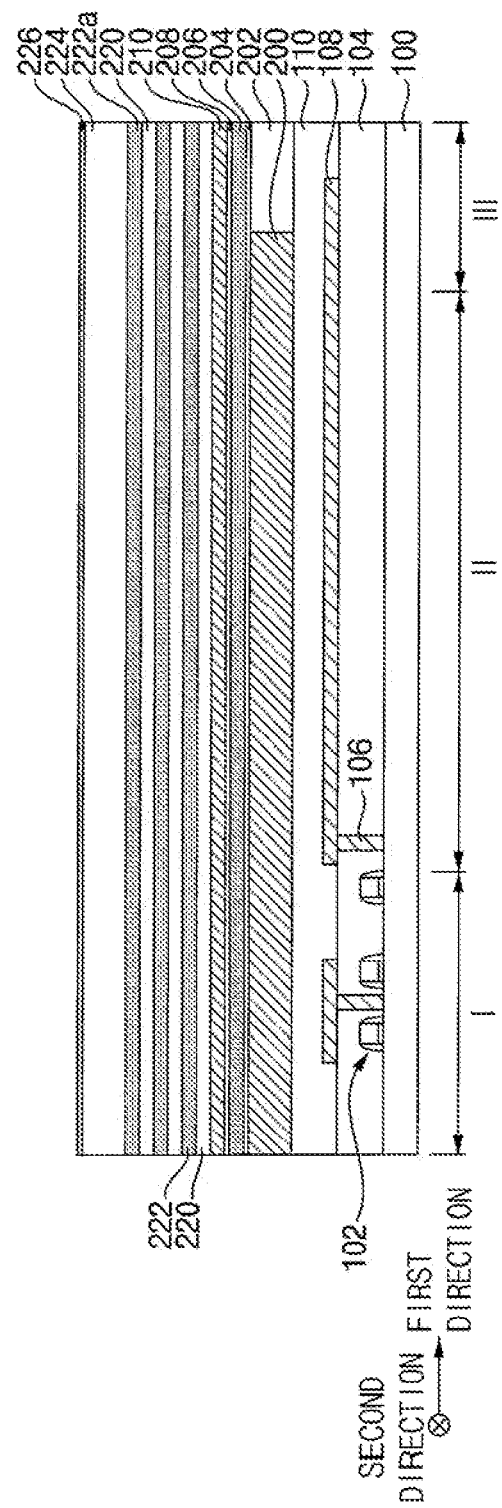

Referring to FIG. 6, a first insulation layer 220 and a first sacrificial layer 222 may be alternately and repeatedly stacked on the support layer 210. An uppermost first insulation layer 224 may be formed on an uppermost first sacrificial layer 222a. A polishing stop layer 226 may be formed on the uppermost first insulation layer 224.

The first insulation layer 220 may include silicon oxide. The first sacrificial layer 222 may include a material having an etch selectivity with respect to the first insulation layer 220. The first sacrificial layer 222 may include, e.g., a nitride such as silicon nitride.

The first sacrificial layer 222 may serve as a sacrificial layer for forming a ground selection transistor and gates of transistors below the ground selection transistor in the NAND flash memory device. In an implementation, one or a plurality of erase control transistors may be below the ground selection transistor.

In an implementation, a first erase control transistor and a second erase control transistor may be formed on the support layer 210, and at least one of the first and second erase control transistors may be used for an erase operation for erasing data stored in memory cells using a gate induced drain leakage (GIDL). The ground selection transistor may be formed on the second erase control transistor.

The first sacrificial layers 222 and 222a sequentially stacked from a bottom may form the gates (refer to FIG. 23, 310) of the first and second erase control transistors and the ground selection line (refer to FIGS. 23, 312) in subsequent processes. Thus, thicknesses of the first sacrificial layers 222 and 222a may be the same as target thicknesses of the gates of the first and second erase control transistors and a target thickness of the ground selection line, respectively. The uppermost first sacrificial layer 222a may form the ground selection line in subsequent processes.

In an implementation, a plurality of ground selection transistors may be formed. In this case, the uppermost first sacrificial layer 222a may serve as a gate of the uppermost ground selection transistor. In an implementation, the erase control transistor may not be formed.

A thickness of the uppermost first insulation layer 224 may be greater than a thickness of the first insulation layer 220 under the uppermost first insulation layer 224 (e.g., in the vertical direction). In an implementation, the uppermost first insulation layer 224 may have the thickness of about 2 times to 5 times of the thickness of the first insulation layer 220 thereunder. Word lines of the memory cells may be formed on the uppermost first insulation layer 224. The uppermost first insulation layer 224 may be formed to have a relatively thick thickness in order to decrease disturbance between the memory cells and the transistors below the memory cells.

The polishing stop layer 226 may include a material substantially the same as the material of the first sacrificial layer 222. The polishing stop layer 226 may include, e.g., silicon nitride. The polishing stop layer 226 may form a portion of a first word line (refer to FIG. 23, 314a) positioned at a lowermost portion in subsequent processes. The polishing stop layer 226 may be formed to have a thickness less than a thickness of the first word line (refer to FIG. 23, 314a). When a target thickness of second word lines (refer to FIG. 23, 314) besides the first word line is a first thickness, the polishing stop layer 226 may be formed to have a second thickness less than the first thickness.

The first insulation layers 220 and the first sacrificial layers 222 repeatedly stacked on the support layer 210 may have flat upper and lower surfaces. In an implementation, the first insulation layers 220 and the first sacrificial layers 222 may not have dishing portions or folding portions.

Figure 7:
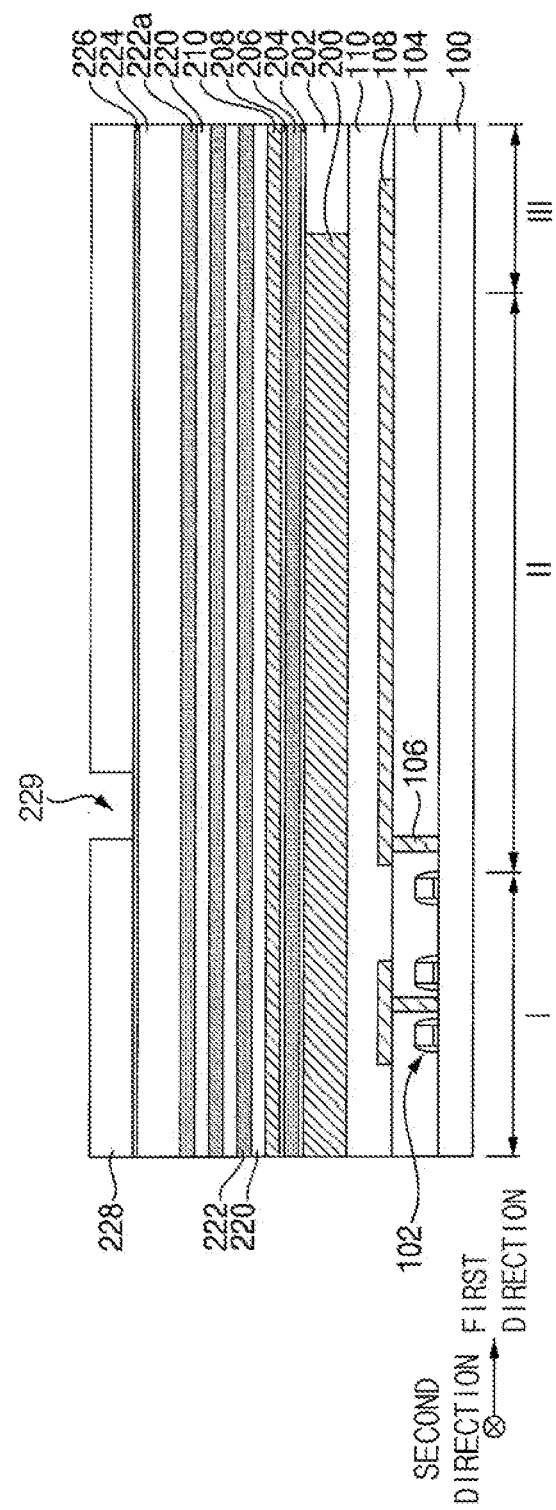

Referring to FIG. 7, a first photoresist layer may be formed on the polishing stop layer 226. The first photoresist layer may be patterned to form a first photoresist pattern 228.

A cutting portion of the ground selection line (refer to FIG. 23, 312) may be in the second region II. In an implementation, a plurality of cutting portions may be spaced apart from each other, and the cutting portions may be repeatedly disposed in the second region II.

The first photoresist pattern 228 may include a second opening 229 exposing a portion corresponding to the cutting portion. The second opening 229 may have an isolated shape.

The first photoresist pattern 228 may entirely cover the first region I and the third region III. The first photoresist pattern 228 may entirely cover the second region II except for the cutting portion.

In an implementation, a portion of the cutting portion may be positioned in or on a word line cutting region extending in the first direction in the second region II. In an implementation, the portion of the cutting portion may overlap a portion between first trenches (refer to FIG. 19, 290) formed in the word line cutting region by subsequent processes. In an implementation, the portion of the cutting portion may overlap a portion in which the first trench is not formed in the word line cutting region. (refer to FIG. 19, 230) In an implementation, the portion of the cutting portion may overlap ends of the first trenches 290 facing each other in the first direction.

Figure 8:
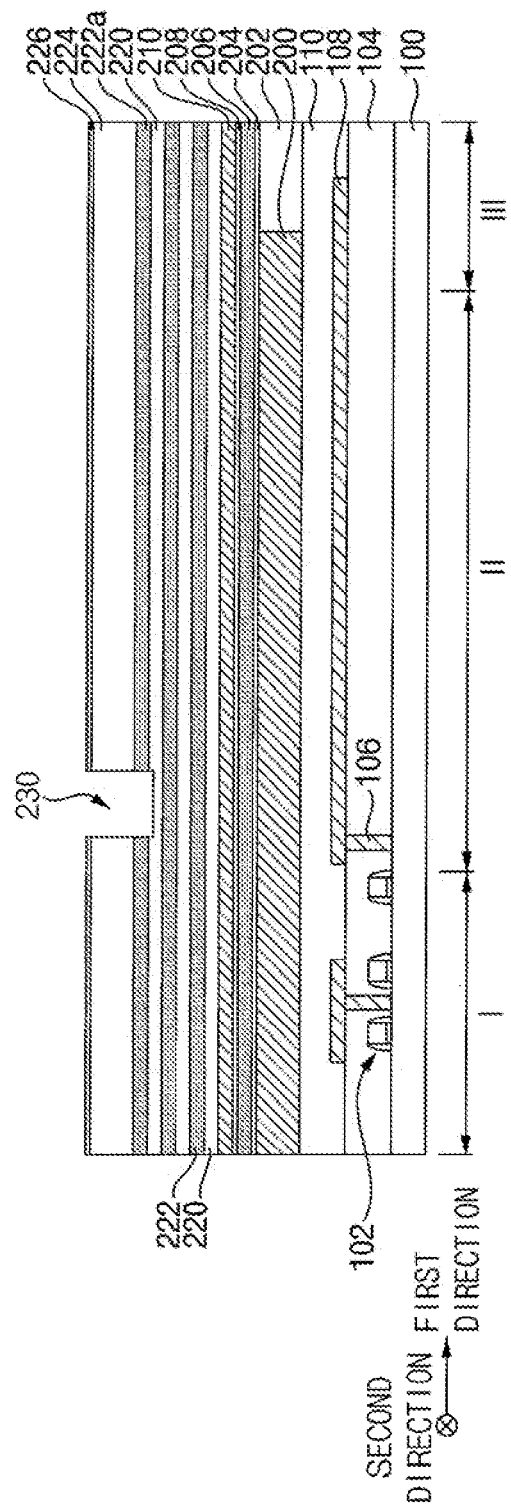

Referring to FIG. 8, the polishing stop layer 226, the uppermost first insulation layer 224, and the uppermost first sacrificial layer 222a may be sequentially etched using the first photoresist pattern 228 as an etching mask to form a third opening 230.

The uppermost first sacrificial layer 222a may be cut by the third opening 230, and a portion of the third opening 230 may correspond to the cutting portion of the ground selection line (refer to FIG. 23, 312) to be subsequently formed. Thus, hereinafter, the cutting portion of the ground selection line is also indicated by the same reference numeral as the third opening 230.

As described above, the uppermost first sacrificial layer 222a for forming the ground selection line may be formed, and the uppermost first insulation layer 224 may be formed on the uppermost first sacrificial layer 222a. Thereafter, the uppermost first insulation layer 224 and the uppermost first sacrificial layer 222a may be etched to form the third opening 230 for cutting of the uppermost first sacrificial layer 222a. Therefore, the upper surface of the uppermost first insulation layer 224 may be substantially flat.

Figure 9:
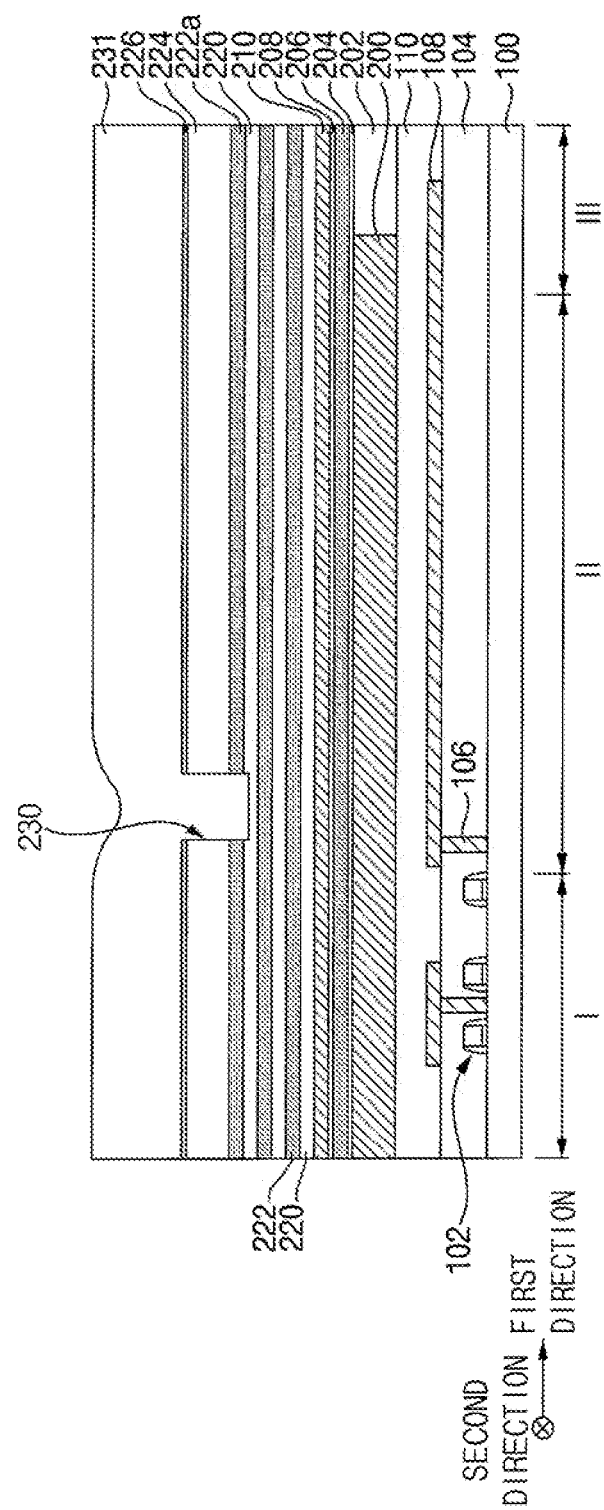

Referring to FIG. 9, an insulation layer 231 may be formed on the polishing stop layer 226 to completely fill the third opening 230.

The insulation layer 231 may include a material having an etching selectivity with respect to the silicon nitride. The insulation layer 231 may include, e.g., silicon oxide. The insulation layer 231 may be formed by an atomic layer deposition (ALD) process, a chemical vapor deposition (CVD) process, a spin-on glass (SOG) coating, or the like.

An upper surface of a portion of the insulation layer 231 filling the third opening 230 may be slightly lower than an upper surface of the insulation layer 231 formed on the polishing stop layer 226. In an implementation, the upper surface of the insulation layer 231 formed in the third opening 230 may have a dishing portion.

Figure 10:
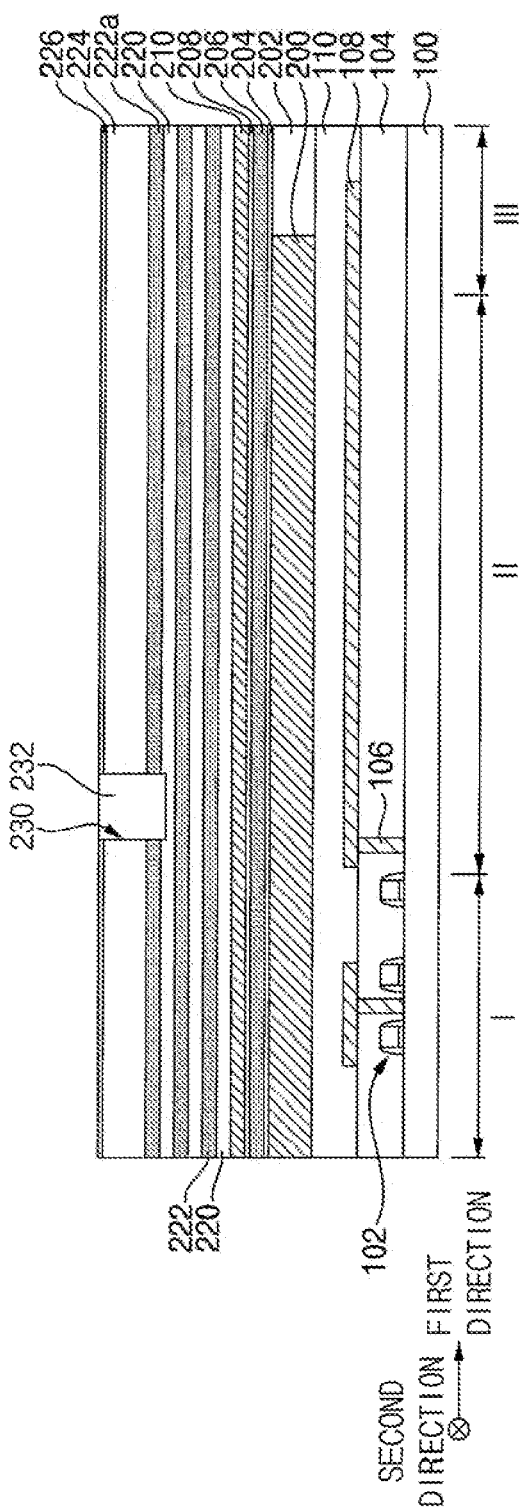
Figure 11:
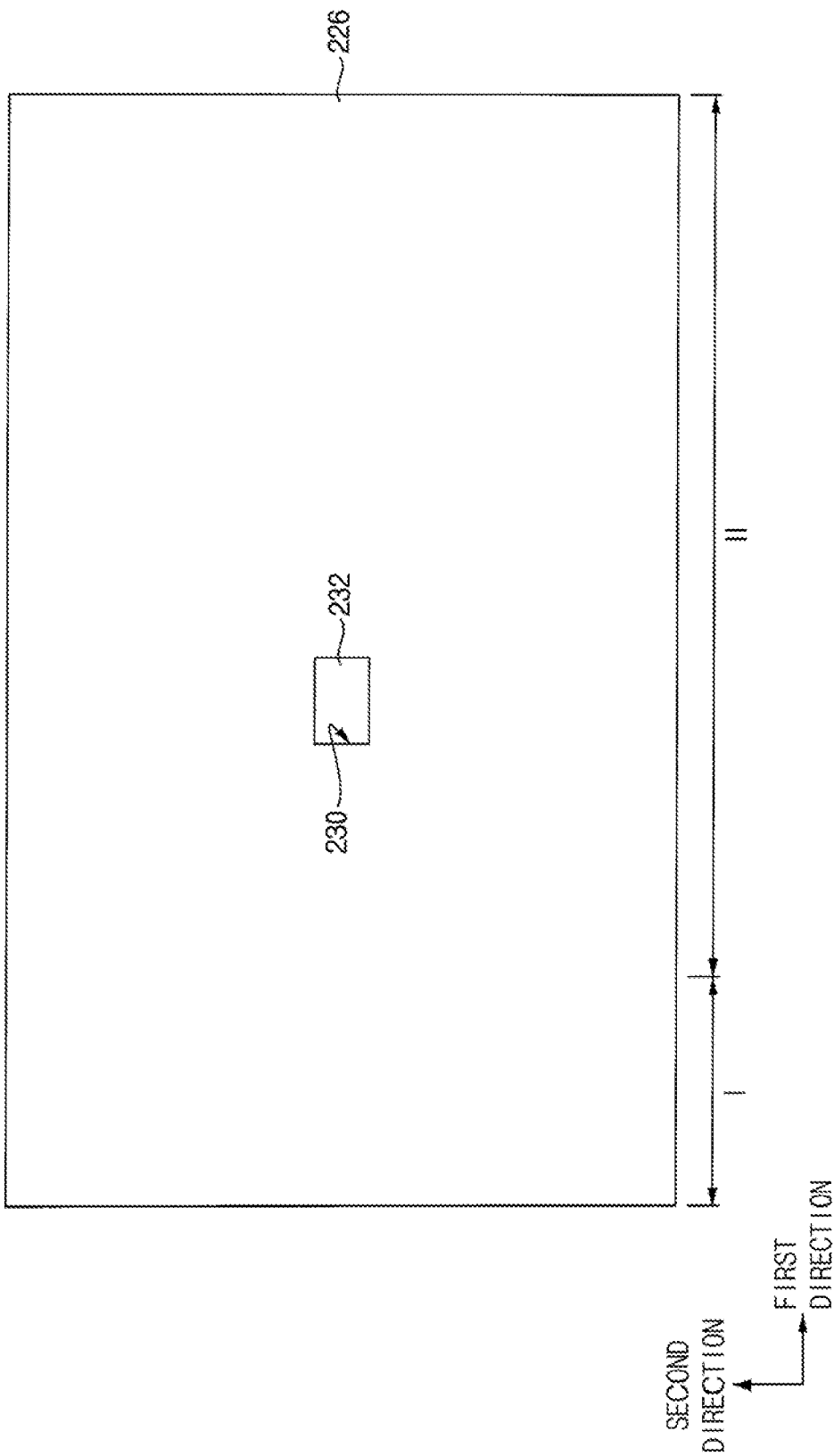

Referring to FIGS. 10 and 11, the upper surface of the insulation layer 231 may be planarized until an upper surface of the polishing stop layer 226 is exposed. Thus, the insulation layer 231 may only remain inside the third opening 230, so that a lower insulation pattern 232 may be formed in the third opening 230.

The planarization process may include a chemical mechanical polishing (CMP) process. In an implementation, the CMP process may be performed using slurry having a polishing selectivity with respect to the polishing stop layer 226. Therefore, the CMP process may be performed until the polishing stop layer 226 is exposed. After the CMP process, an upper surface of the lower insulation pattern 232 may be coplanar with an upper surface of the polishing stop layer 226. The upper surface of the lower insulation pattern 232 and the upper surface of the polishing stop layer 226 may be substantially flat. The upper surface of the lower insulation pattern 232 may not include a dishing portion.

Figure 12:
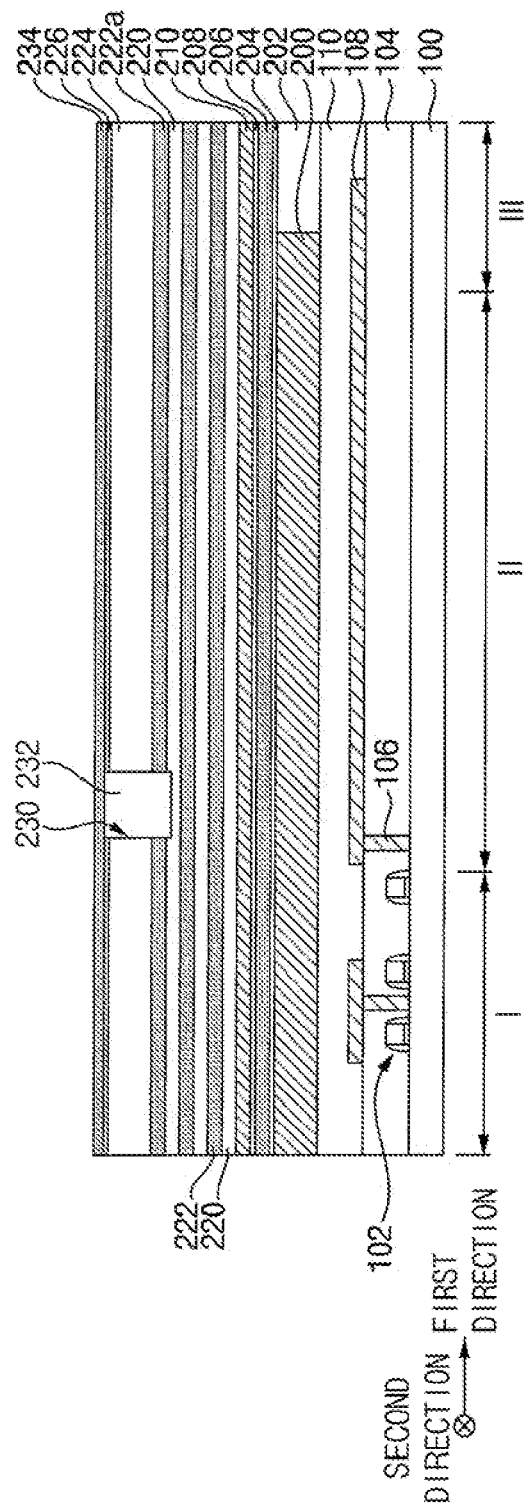

Referring to FIG. 12, a second sacrificial layer 234 may be formed on the polishing stop layer 226 and the lower insulation pattern 232. The polishing stop layer 226 and the second sacrificial layer 234 may form the first word line (refer to FIG. 23, 314a) in subsequent processes. In an implementation, a sum of the thicknesses of the polishing stop layer 226 and the second sacrificial layer 234 may be equal to the first thickness, which is the target thickness of the second word line (refer to FIG. 23, 314).

The second sacrificial layer 234 may have a third thickness (e.g., in the vertical direction). The second sacrificial layer 234 may have the thickness less than a thickness of each of third sacrificial layers 242 (for subsequently forming word lines).

The polishing stop layer 226 and the second sacrificial layer 234 may be formed on the uppermost first insulation layer 224. The polishing stop layer 226 may not be formed on the lower insulation pattern 232, and only the second sacrificial layer 234 may be formed on the lower insulation pattern 232. Therefore, the first word line (refer to FIG. 23, 314a) subsequently formed on the lower insulation pattern 232 may have a thickness less than a thickness of the first word line subsequently formed on the uppermost first insulation layer 224.

Figure 13:
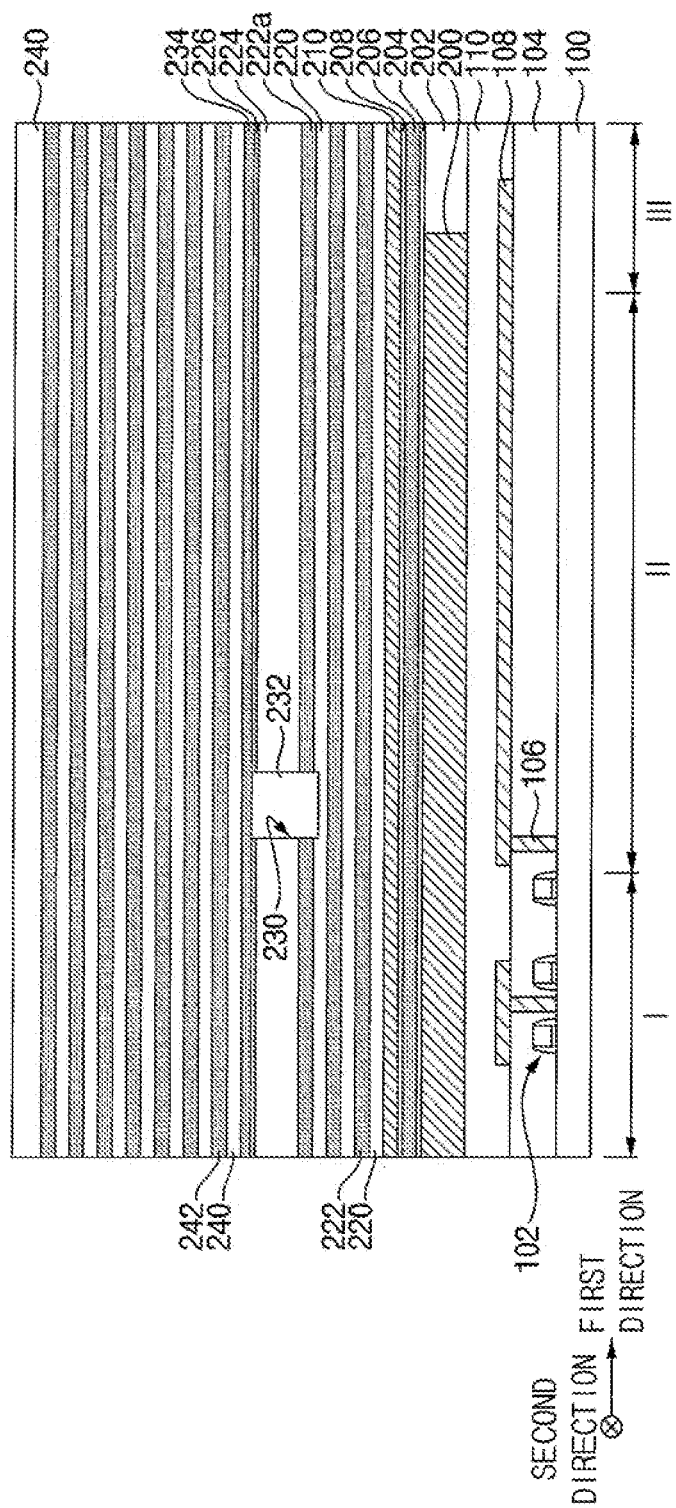

Referring to FIG. 13, second insulation layers 240 and third sacrificial layers 242 may be alternately and repeatedly formed on the second sacrificial layer 234. Each of the third sacrificial layers 242 may have the first thickness which is the target thickness of the second word line (refer to FIG. 23, 314). The third sacrificial layers 242 may form lower word lines at a lower portion of the cell stacked structure (refer to FIG. 23, 320). An upper surface of each of the third sacrificial layers 242 may be substantially flat. A lower surface of each of the third sacrificial layers 242 may be substantially flat.

Figure 14:
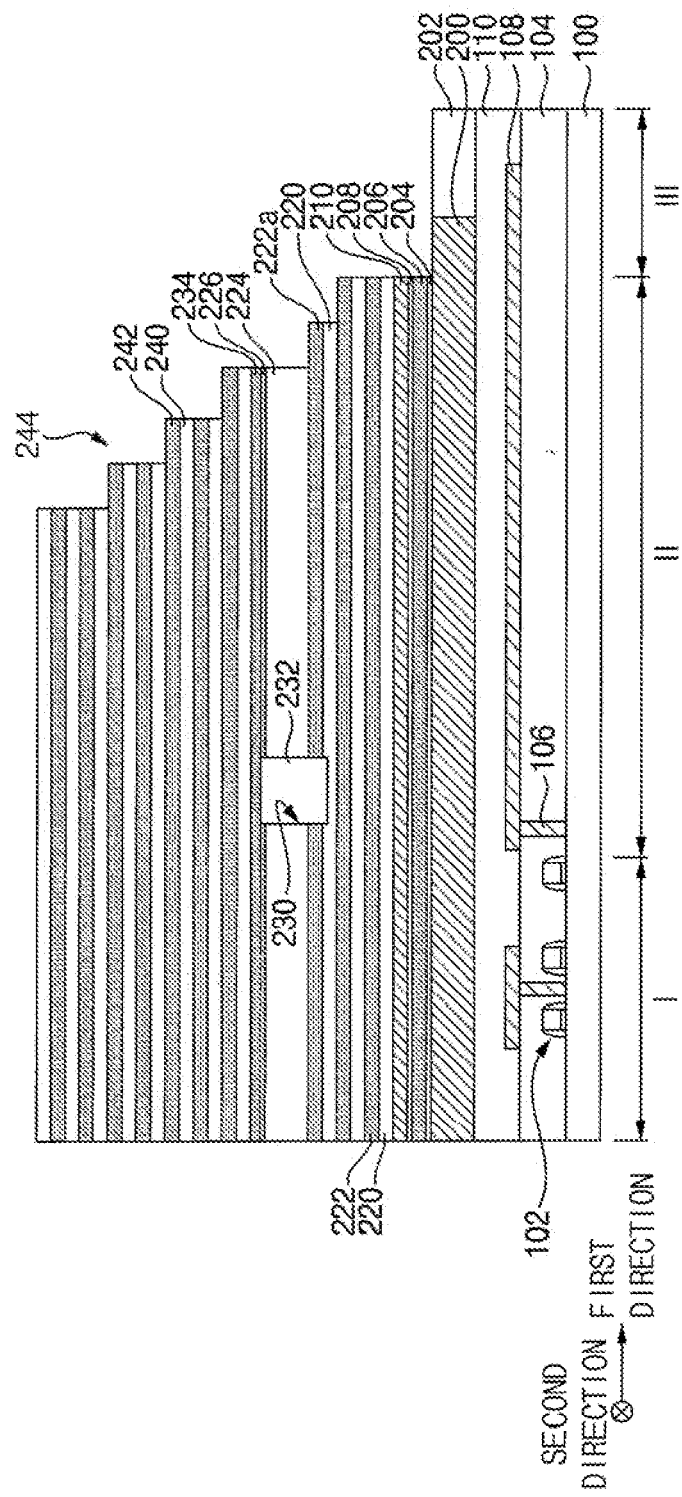

Referring to FIG. 14, the third sacrificial layers 242, the second insulation layers 240, the second sacrificial layer 234, the first insulation layers 220 and the first sacrificial layers 222 may be patterned to form a preliminary first cell mold structure 244 on the first and second regions I and II.

An edge portion of the preliminary first cell mold structure 244 may have a staircase shape. Hereinafter, each of steps may be referred to as an exposed upper surface of the preliminary first cell mold structure 244 in the edge portion. The steps of the preliminary first cell mold structure 244 may be on the second region II.

The steps of the preliminary first cell mold structure 244 may be formed in the first direction. In an implementation, the steps of the preliminary first cell mold structure 244 may be formed in the first and second directions.

Figure 15:
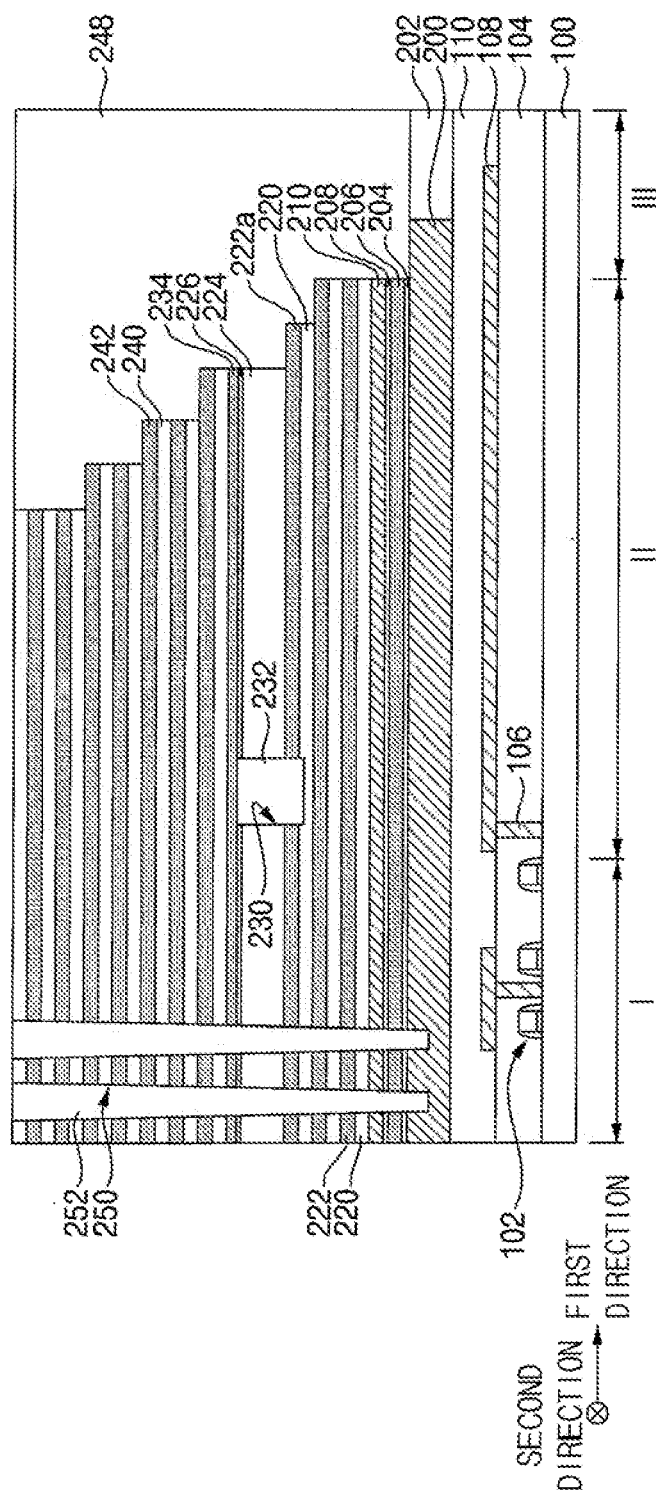

Referring to FIG. 15, an insulating interlayer may be formed to cover the preliminary first cell mold structure 244, the base semiconductor pattern 200, and the lower filling pattern 202. Thereafter, an upper portion of the insulating interlayer may be planarized by a planarization process to form a first interlayer insulation pattern 248. The planarization process may include a CMP process. Thus, upper surfaces of the preliminary first cell mold structure 244 and the first interlayer insulation pattern 248 may be substantially flat. The upper surfaces of the preliminary first cell mold structure 244 and the first interlayer insulation pattern 248 may be coplanar with each other.

The preliminary first cell mold structure 244 on the first region I may be etched by a photolithography process to form a lower channel hole 250 exposing an upper surface of the base semiconductor pattern 200. A filling sacrificial layer 252 may be formed to fill the lower channel hole 250. The filling sacrificial layer 252 may include, e.g., silicon oxide or polysilicon. In an implementation, a plurality of lower channel holes 250 may be formed through the preliminary first cell mold structure 244.

In an implementation, the preliminary first cell mold structure 244 and the first interlayer insulation pattern 248 on the second region II may be etched together by the photolithography process to form a dummy lower channel hole. In an implementation, the filling sacrificial layer may be formed to fill the dummy lower channel hole.

Figure 16:
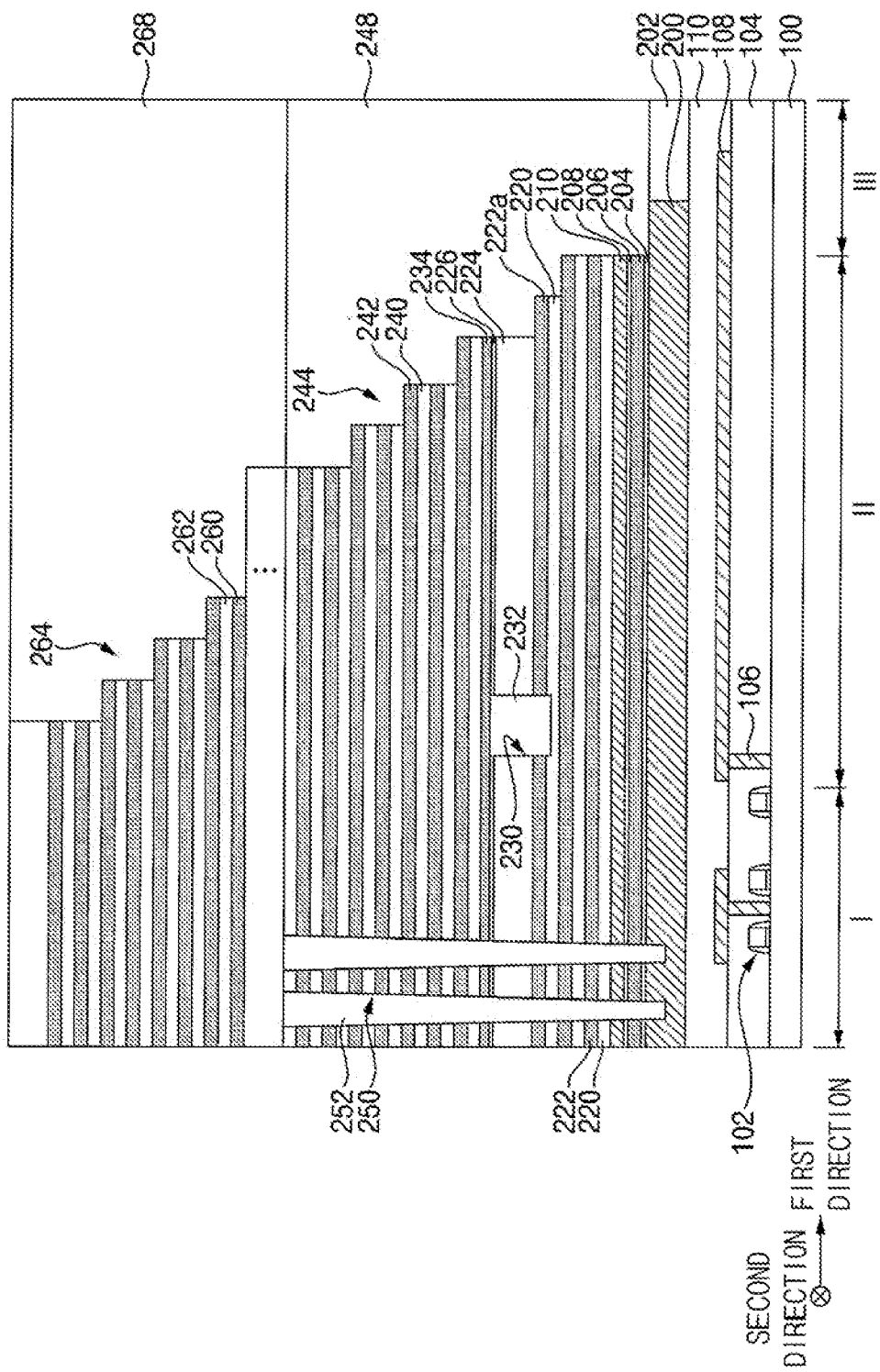

Referring to FIG. 16, third insulation layers 262 and fourth sacrificial layers 260 may be alternately and repeatedly formed on the preliminary first cell mold structure 244, the filling sacrificial layer 252, and the first interlayer insulation pattern 248. In this case, an upper surface of each of the fourth sacrificial layers 260 may be substantially flat. A lower surface of each of the fourth sacrificial layers 260 may be substantially flat.

In an implementation, the fourth sacrificial layers 260 may be provided to form upper word lines at an upper portion of the cell stacked structure (refer to FIG. 23, 320) and a gate of the string selection transistor (i.e., a string selection line). The fourth sacrificial layer 260 may have the first thickness which is the target thickness of the second word line (refer to FIG. 23, 314).

In an implementation, the third insulation layer 262 directly contacting on the preliminary first cell mold structure 244, the filling sacrificial layer 252, and the first interlayer insulation pattern 248 may serve as a buffer insulation layer. Therefore, a thickness of the third insulation layer 262 directly contacting on the preliminary first cell mold structure 244, the filling sacrificial layer 252, and the first interlayer insulation pattern 248 may be greater than a thickness of other third insulation layer 262 thereon.

The third insulation layers 262 and the fourth sacrificial layers 260 may be patterned to form a preliminary second cell mold structure 264 on the preliminary first cell mold structure 244. Hereinafter, a stacked structure including the preliminary first cell mold structure 244 and the preliminary second cell mold structure 264 is referred to as a preliminary cell mold structure.

An edge portion in the first direction of the preliminary second cell mold structure 264 may have a staircase shape connected from (e.g., extending from) the preliminary first cell mold structure 244. The steps of the preliminary second cell mold structure 264 may be on the second region II.

A second insulating interlayer may be formed on the preliminary second cell mold structure 264 and the first interlayer insulation pattern 248. An upper portion of the second insulating interlayer may be planarized until an upper surface of the preliminary second cell mold structure 264 is exposed to form a second interlayer insulation pattern 268. The second interlayer insulation pattern 268 may cover a sidewall of the preliminary second cell mold structure 264.

Figure 17:
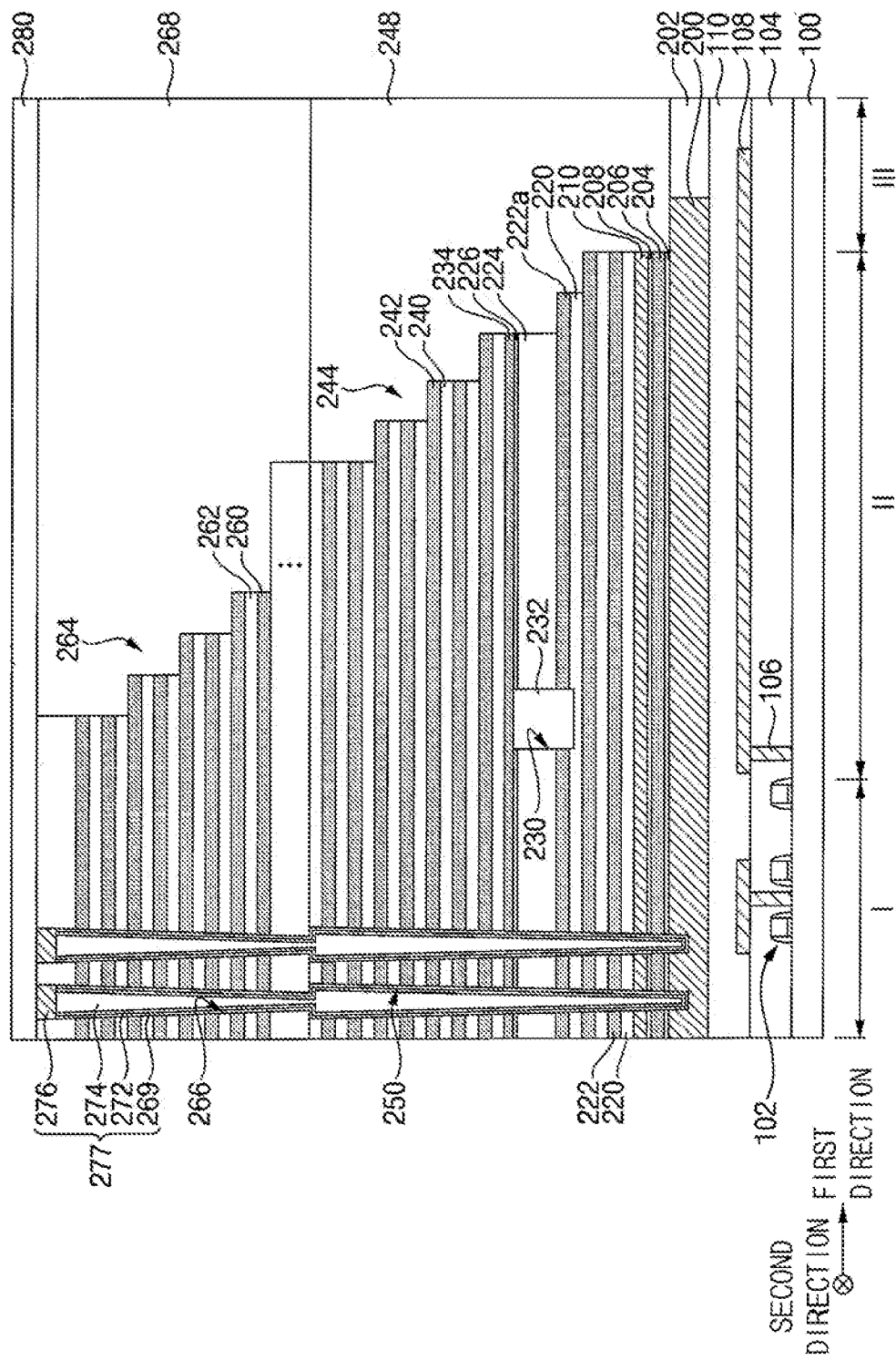
Figure 18:
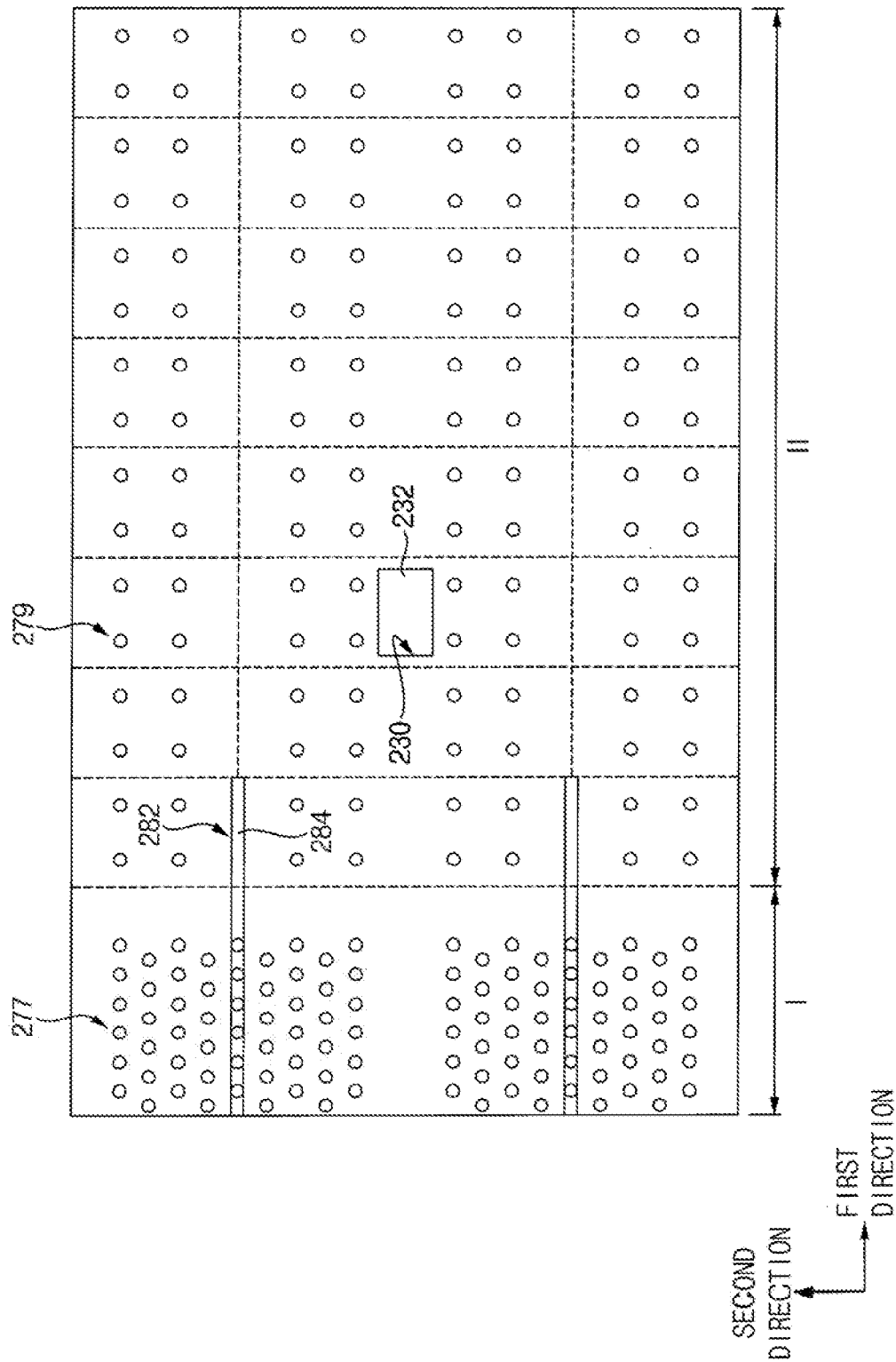

Referring to FIGS. 17 and 18, the preliminary second cell mold structure 264 on the first region I may be etched by a photolithography process to form a channel hole. The channel hole may pass through the preliminary second cell mold structure 264, and may expose an upper surface of the filling sacrificial layer 252.

In an implementation, an upper dummy channel hole may be formed together on the lower dummy channel hole by the photolithography process.

The filling sacrificial layer 252 filling in the lower channel hole 250 may be removed to form a channel hole 266 in which the lower channel hole 250 and the upper channel hole communicate with each other. In an implementation, a dummy channel hole in which the lower dummy channel hole and an upper dummy channel hole communicate (e.g., are continuous) with each other may be formed together.

A preliminary channel structure 277 may be formed in the channel hole 266. In an implementation, a dummy channel structure (refer to FIG. 18, 279) may be formed in the dummy channel hole.

The preliminary channel structure 277 may include a preliminary charge storage structure 269, a channel 272, a filling insulation pattern 274, and a capping pattern 276. The preliminary charge storage structure 269 may include a preliminary first blocking layer, a preliminary charge storage layer, and a preliminary tunnel insulation layer sequentially stacked on a sidewall of the channel hole 266.

A third insulating interlayer 280 may be formed on the preliminary cell mold structure and the second interlayer insulation pattern 268.

Thereafter, the third insulating interlayer 280, a portion of the third insulation layers 262, and a portion of the fourth sacrificial layers 260 may be etched using an etching mask to form an upper trench 282 extending in the first direction. An upper separation pattern 284 may be formed to fill the upper trench 282. The fourth sacrificial layer 260 for forming the gate of the string selection transistor may be separated by the upper separation pattern 284. Thus, the upper separation pattern 284 may be a cutting portion of a string selection line.

Figure 19:
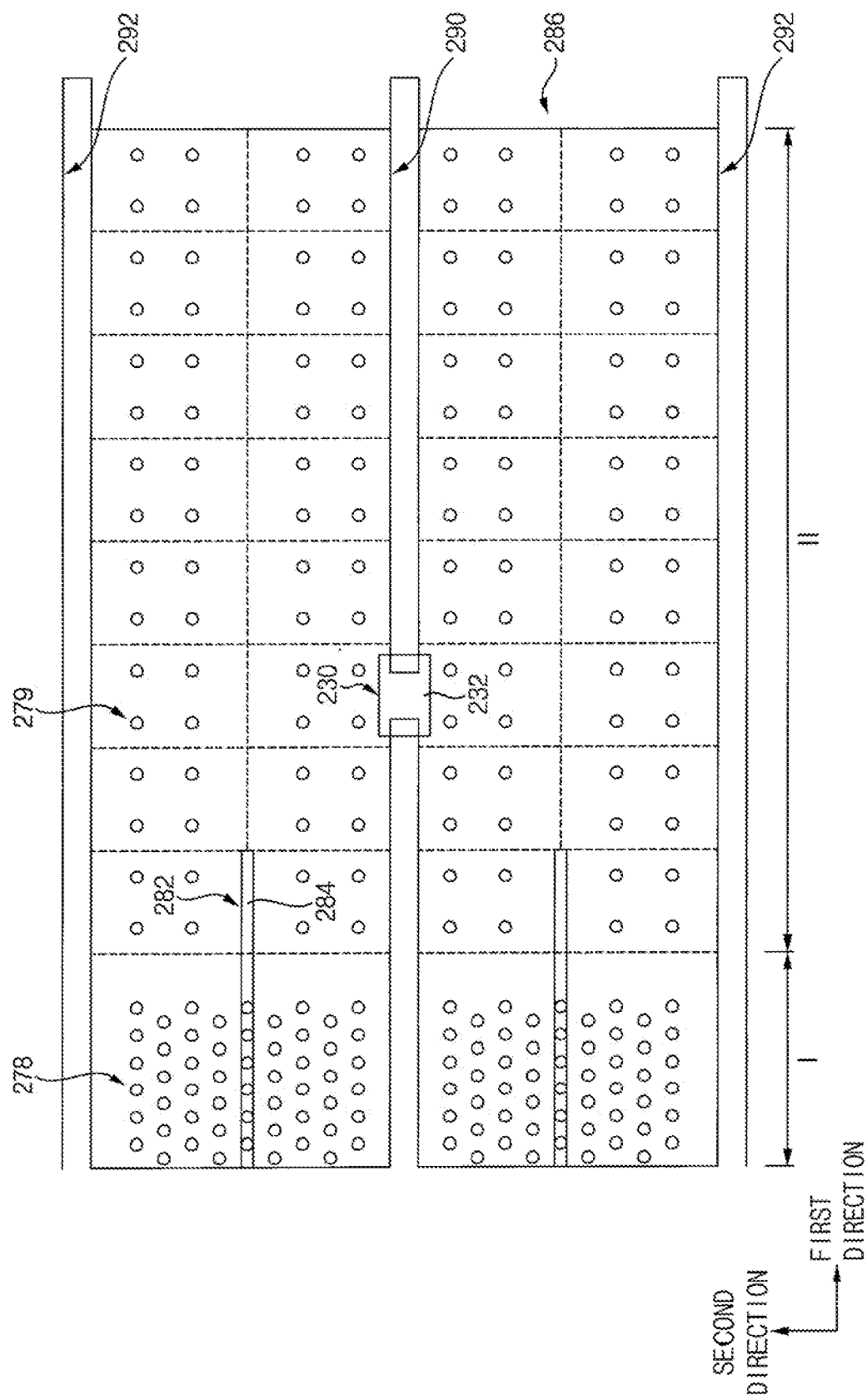

Referring to FIG. 19, the preliminary cell mold structure, the third insulating interlayer 280, the second interlayer insulation pattern 268, and the first interlayer insulation pattern 248 may be etched by an etching process using an etching mask to form preliminary trenches.

An upper surface of the support layer 210 may be exposed by bottoms of the preliminary trenches. Spacers may be further formed on sidewalls of the preliminary trenches. Thereafter, lower portions of the preliminary trenches may be further etched to form a first trench 290 and a second trench 292 exposing the upper surface of the base semiconductor pattern 200.

Each of the first and second trenches 290 and 292 may extend (e.g., lengthwise) in the first direction, and the preliminary cell mold structure may be separated in the second direction. The first and second trenches 290 and 292 may be formed in a word line cutting region. As the first and second trenches 290 and 292 are formed, the preliminary cell mold structure may form cell mold structures (refer to FIG. 19, 286) extending in the first direction.

On the second region II, a plurality of first trenches 290 may be spaced apart from each other in the first direction. The cell mold structure may have a connected shape without separating of the cell mold structure at a portion in which the first trench 290 is not formed (e.g., a portion between the first trenches). The portion in which the first trench 290 is not formed is referred to as a connection portion, and the connection portion may overlap the cutting portion 230 of the ground selection line. In an implementation, the cutting portion 230 of the ground selection line may be under the connection portion.

The second trench 292 may serve as a block cutting region. Thus, the second trench 292 may extend from the first region to the second region, and may not have a connection portion.

In neighboring cell mold structures 286 at both sides of the first trench 290, the uppermost first sacrificial layer 222a may be cut by the first trench and the third opening 230. In an implementation, in the neighboring cell mold structures 286 at both sides of the first trench 290, the first, second and third sacrificial layers 222, 234 and 242 (excluding the uppermost first sacrificial layer 222a) may be cut by only the first trench, so that the first, second, and third sacrificial layers 222, 234, and 242 may be connected in the second direction at the connected portion.

Figure 20:
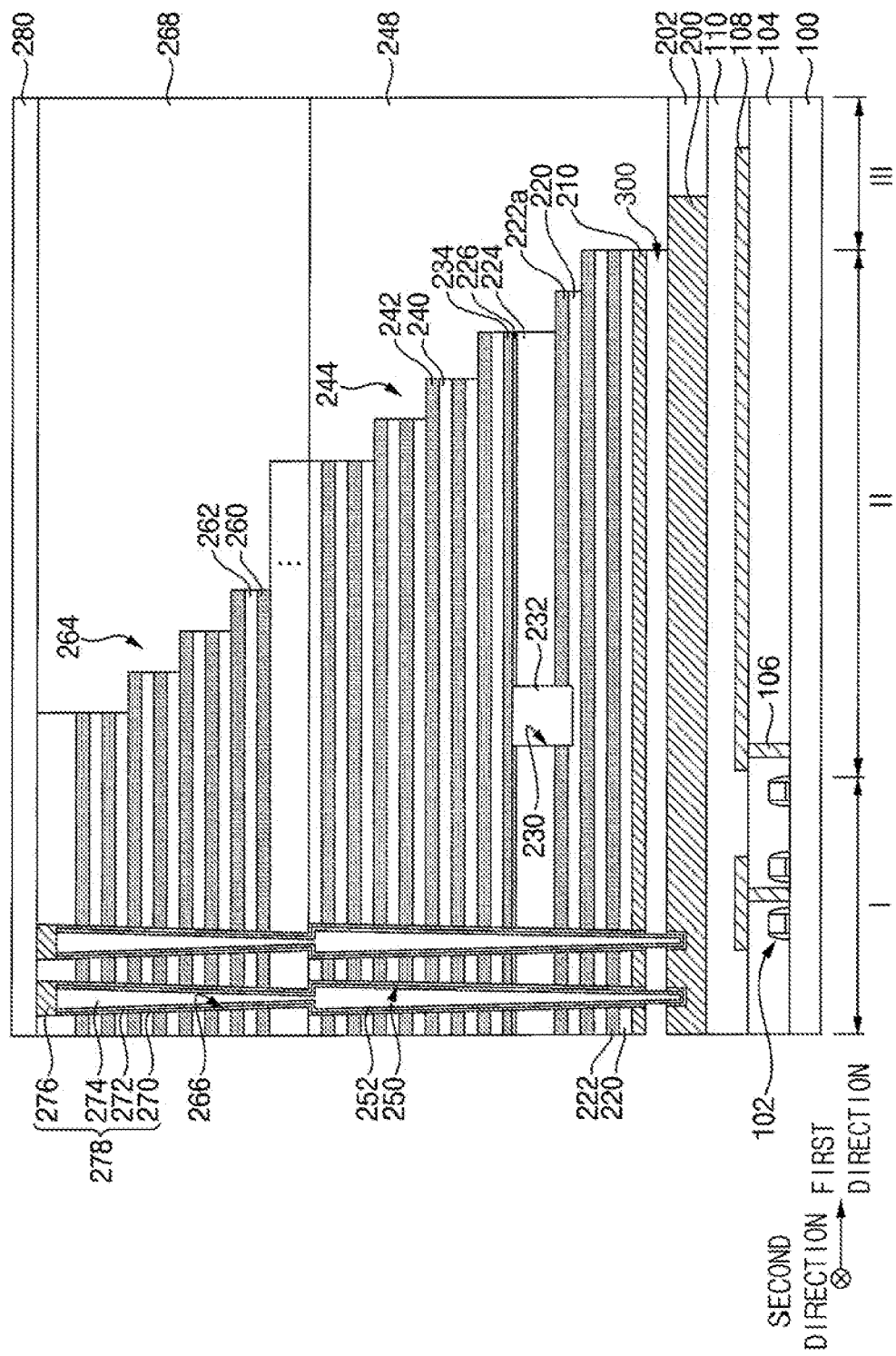

Referring to FIG. 20, the lower sacrificial layer structures 204, 206, and 208 may be removed by e.g., a wet etching process to form a first gap 300. Sidewalls of the preliminary charge storage structure 269 may be exposed by the first gap 300. The exposed sidewalls of the preliminary charge storage structure 269 may be removed by a wet etching process to expose an outer wall of the channel 272. The preliminary charge storage structure 269 may form a charge storage structure 270 by the wet etching process. Further, a channel structure 278 may be formed in the channel hole by the wet etching process.

The spacers on sidewalls of the first and second trenches 290 and 292 may be removed.

Figure 21:
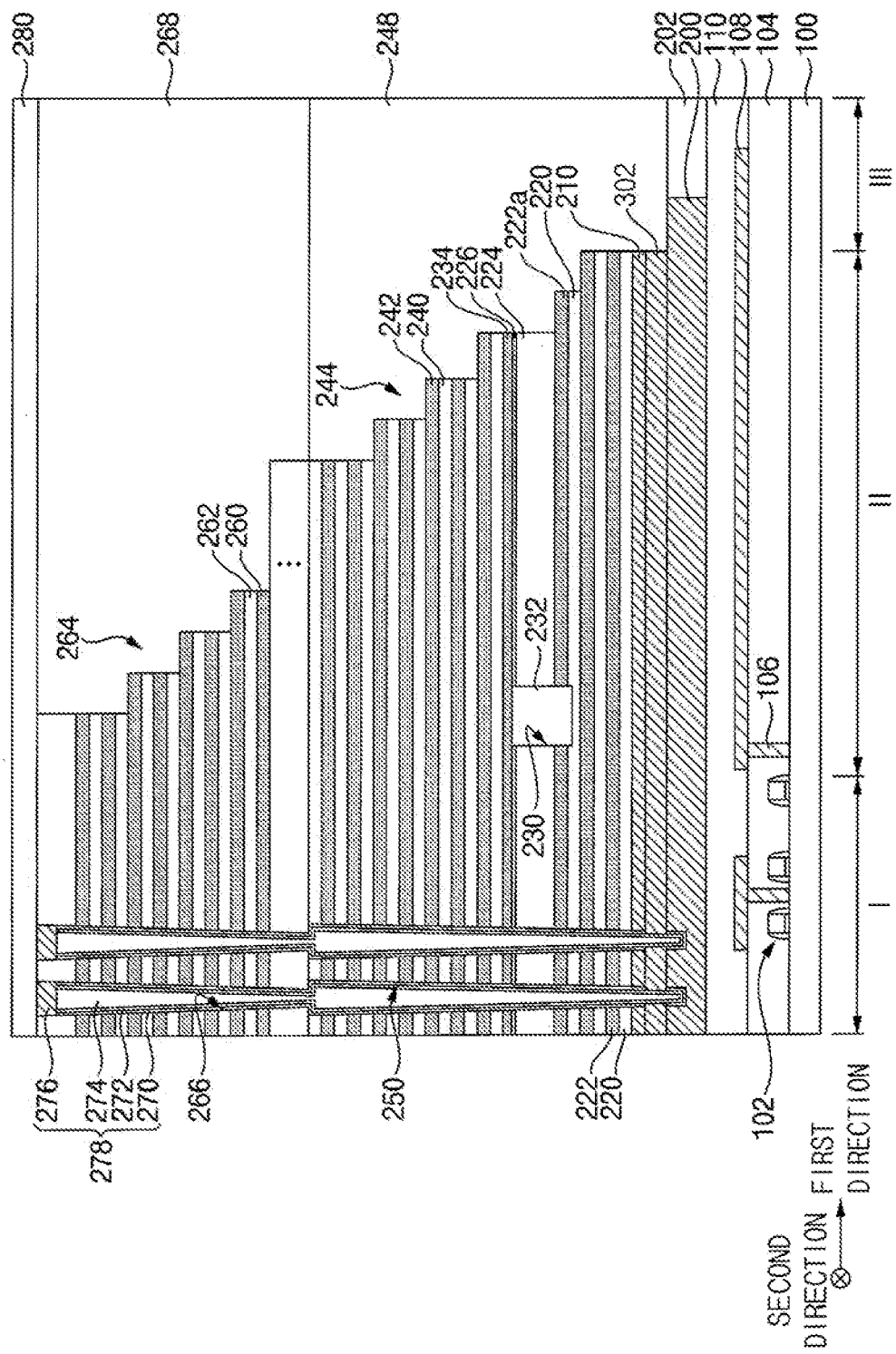

Referring to FIG. 21, a channel connection pattern 302 may be formed to fill the first gap 300. The channel connection pattern 302 may include polysilicon doped with n-type impurities. The channel 272 and the base semiconductor pattern 200 may be electrically connected by the channel connection pattern 302.

Figure 22:
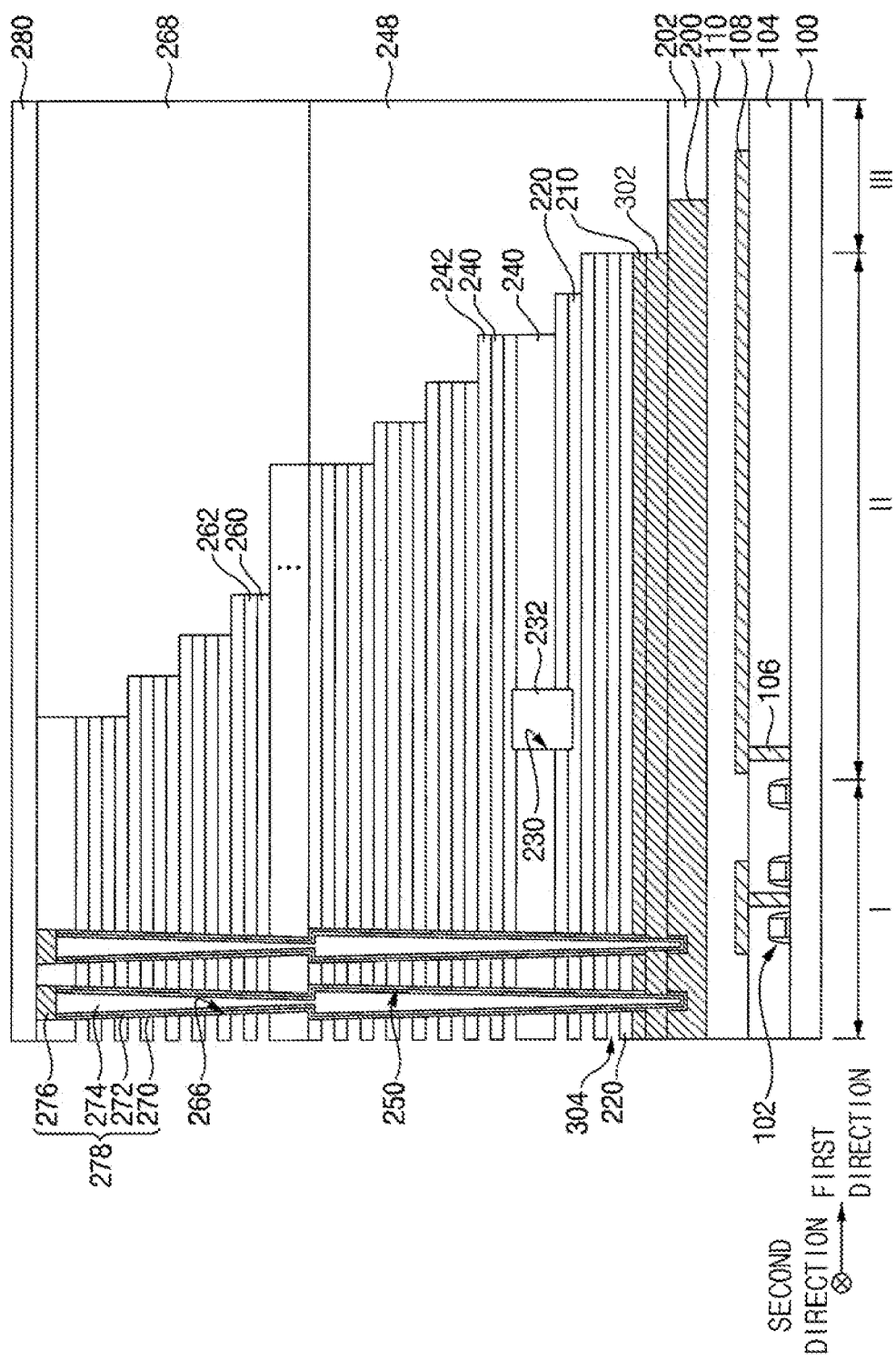

Referring to FIG. 22, the first to fourth sacrificial layers 222, 222a, 234, 242, 260 and the polishing stop layer 226 exposed by sidewalls of the first and second trenches 290 and 292 may be removed by e.g., a wet etching process to form second gaps 304 between the first to third insulation layers 220, 224, 240, and 262.

Figure 23:
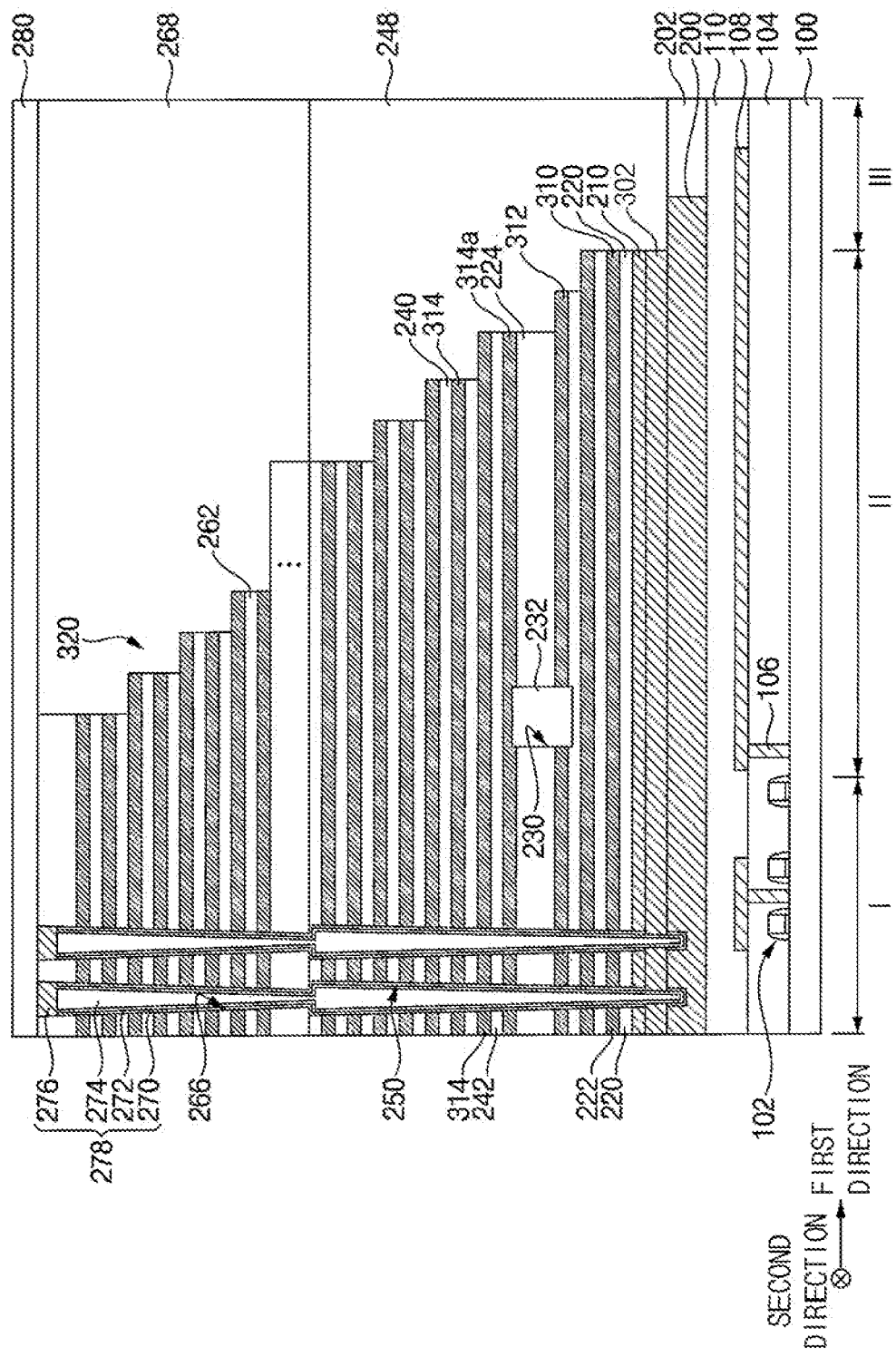

Referring to FIG. 23, a second blocking layer may be conformally formed on sidewalls and bottoms of the first and second trenches 290 and 292 and inner surfaces of the second gaps 304. A second conductive layer may be formed on the second blocking layer.

The second blocking layer may include, e.g., a metal oxide such as aluminum oxide. The conductive layer may include a metal barrier layer and a metal layer.

A gate pattern may be formed in each of the second gaps 304 by partially removing the conductive layer. In an implementation, the gate pattern may extend in the first direction. A plurality of gate patterns may be spaced apart from each other in the vertical direction. In an implementation, the first to fourth sacrificial layers 222, 222a, 234, 242, 260 and the polishing stop layer 226 may be replaced with the gate patterns. Thus, the cell mold structure 286 may be replaced with a cell stacked structure 320 in which the insulation layers and the gate patterns are repeatedly stacked. The process of replacing the sacrificial layer with the conductive pattern may be referred to as a metal replacement process.

In an implementation, the uppermost first sacrificial layer 222a may be replaced with a ground selection line 312. The first sacrificial layer 222 under the uppermost first sacrificial layer 222a may be replaced with a gate pattern 310 of an erase control transistor. In an implementation, the second and third sacrificial layers 234 and 242 above the uppermost first sacrificial layer 222a may be replaced with word lines 314a and 314 or a string selection line.

In the first word line 314a immediately above (e.g., closest to in the vertical direction) the ground selection line 312, a portion facing the lower insulation pattern 232 may have a thickness less than a thickness of other portions thereof. In an implementation, the first word line 314a may serve as a dummy word line. In an implementation, the first word line 314a may serve as a word line used as an actual memory cell.

Figure 25:
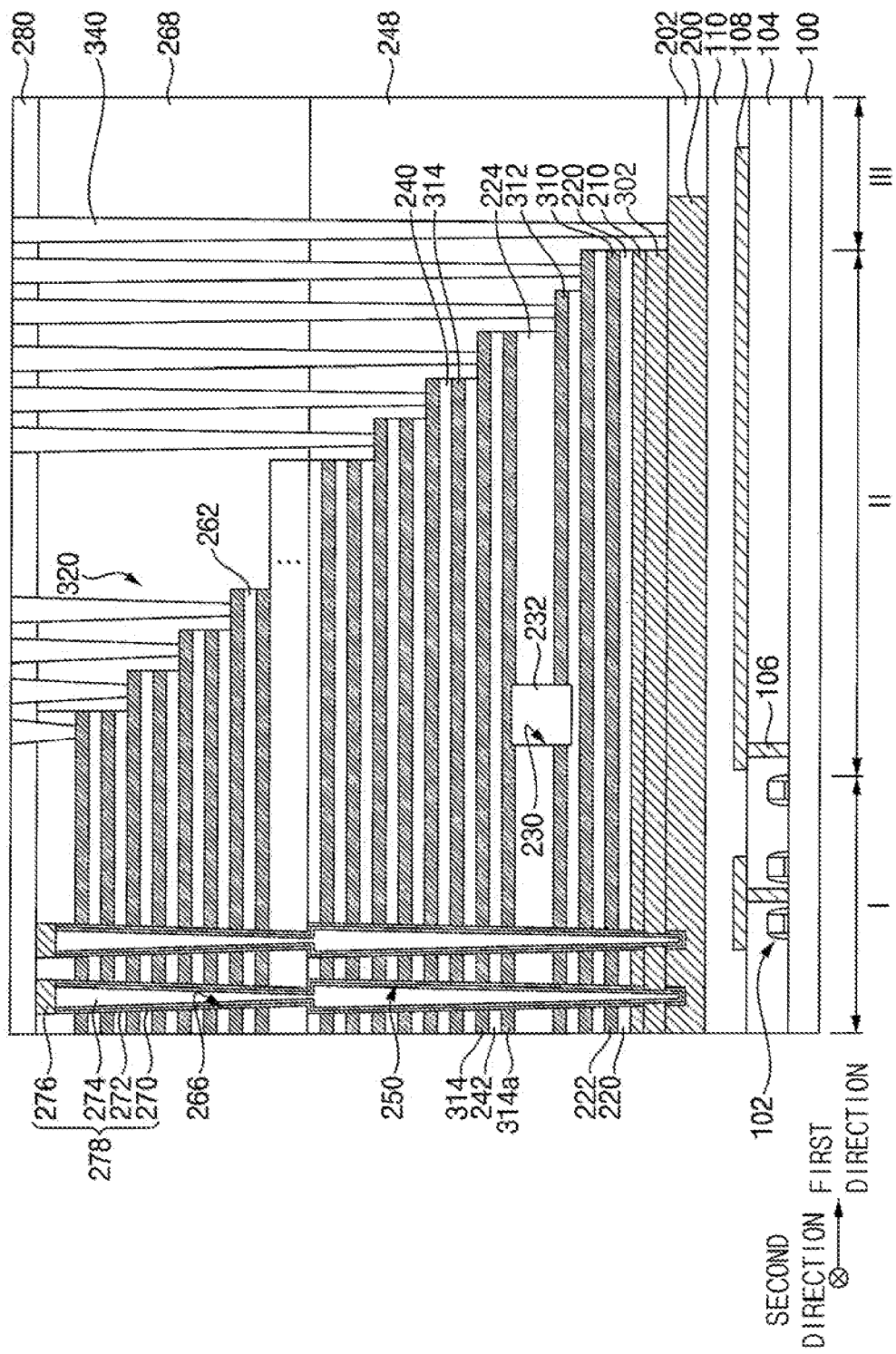

Referring to FIGS. 24 and 25, a separation layer may be formed to fill the first and second trenches 290 and 292. The separation layer may be planarized until an upper surface of the third insulating interlayer 280 is exposed to form a separation layer pattern 330. The separation layer pattern 330 may be formed in the first and second trenches 290 and 292. The separation layer pattern 330 may include, e.g., an oxide such as silicon oxide.

The first and second interlayer insulation patterns 248 and 268 and the third insulating interlayer 280 on the second region II may be etched by a photolithography process to form cell contact holes exposing steps of the gate patterns.

A conductive material may be formed in the cell contact holes to form a cell contact plug 340. The cell contact plug 340 may include a barrier metal layer and a metal layer.

In an implementation, an upper insulating interlayer may be further formed on the third insulating interlayer 280. In an implementation, through via contacts may be further formed through the upper insulating interlayer and insulating materials under the upper insulating interlayer and the lower filling pattern 202. The through via contacts may contact the lower pad pattern. In an implementation, the through via contacts may be formed on the third region III. In an implementation, some of through via contacts may be formed through a portion of the cell stacked structure 320 on the first and second regions I and II.

In an implementation, upper wirings may be further formed on the upper insulating interlayer. The upper wirings may be electrically connected with the cell contact plug 340 and/or the through via contacts.

By performing the above processes, a NAND flash memory device may be manufactured.

Figure 26:
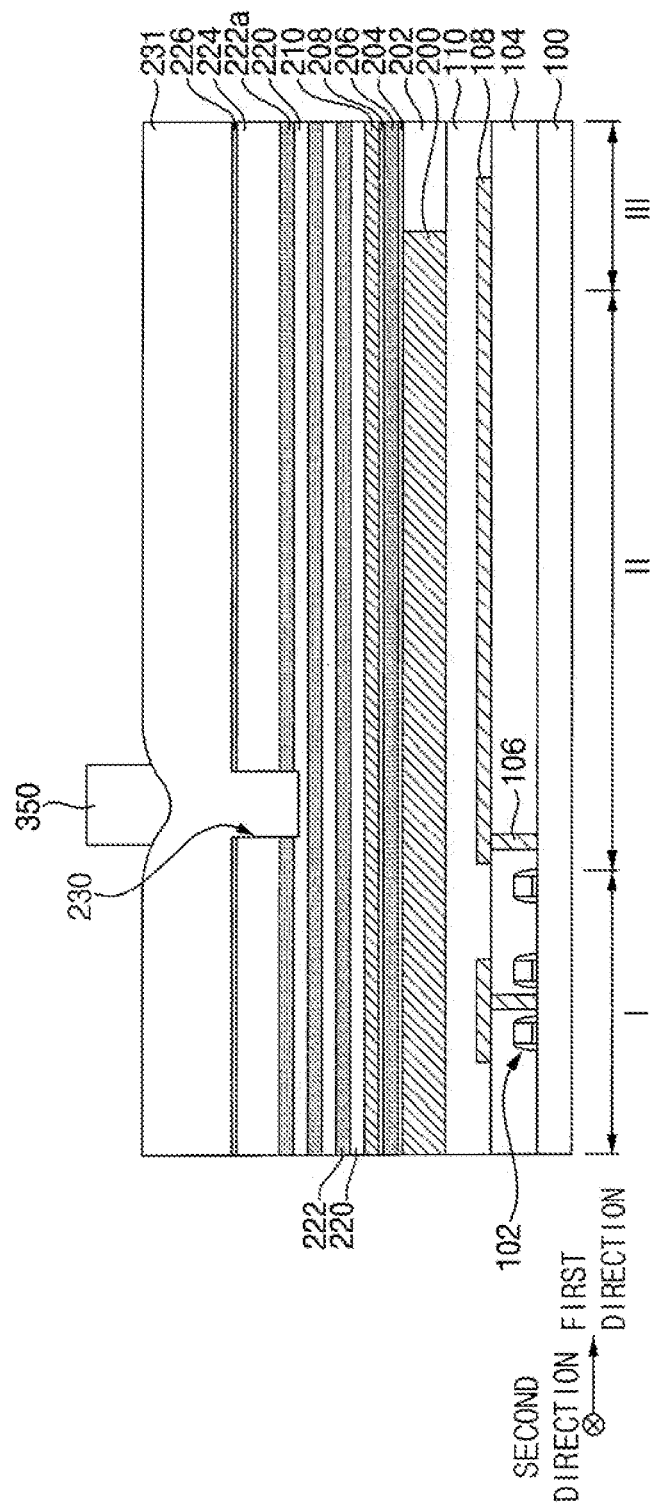
FIGS. 26 to 28 are cross-sectional views of stages in a method of manufacturing a NAND flash memory device in accordance with example embodiments.
Figure 27:
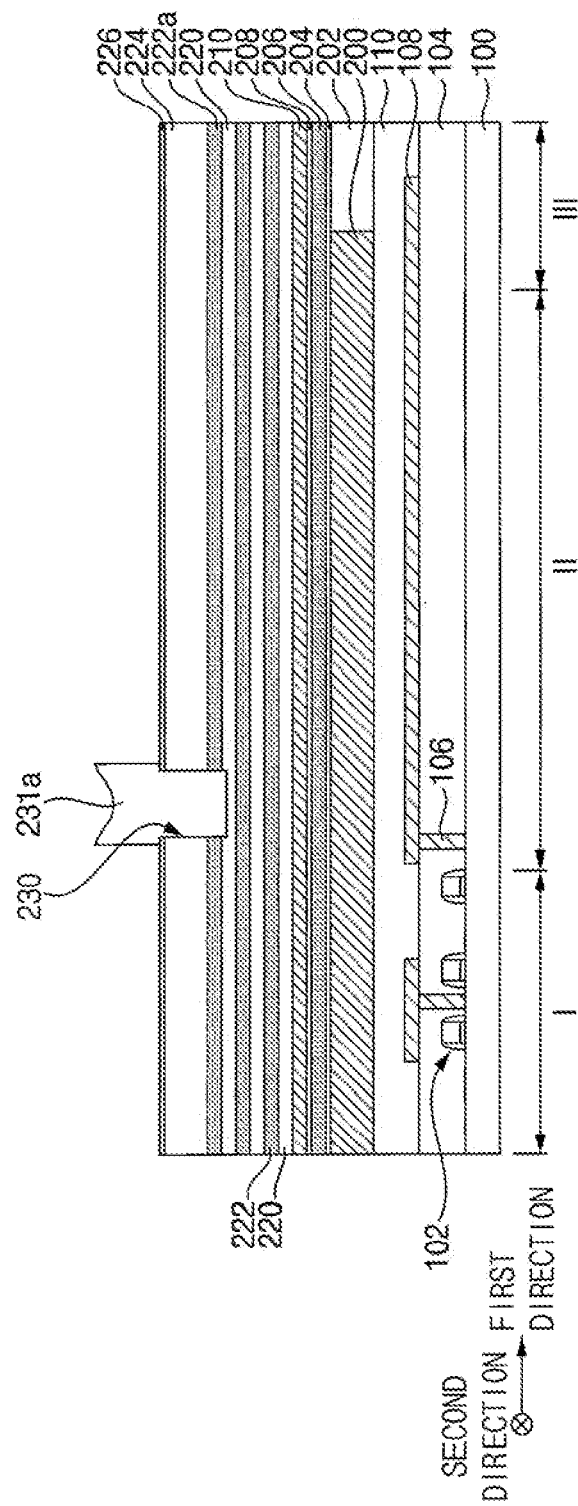
Figure 28:
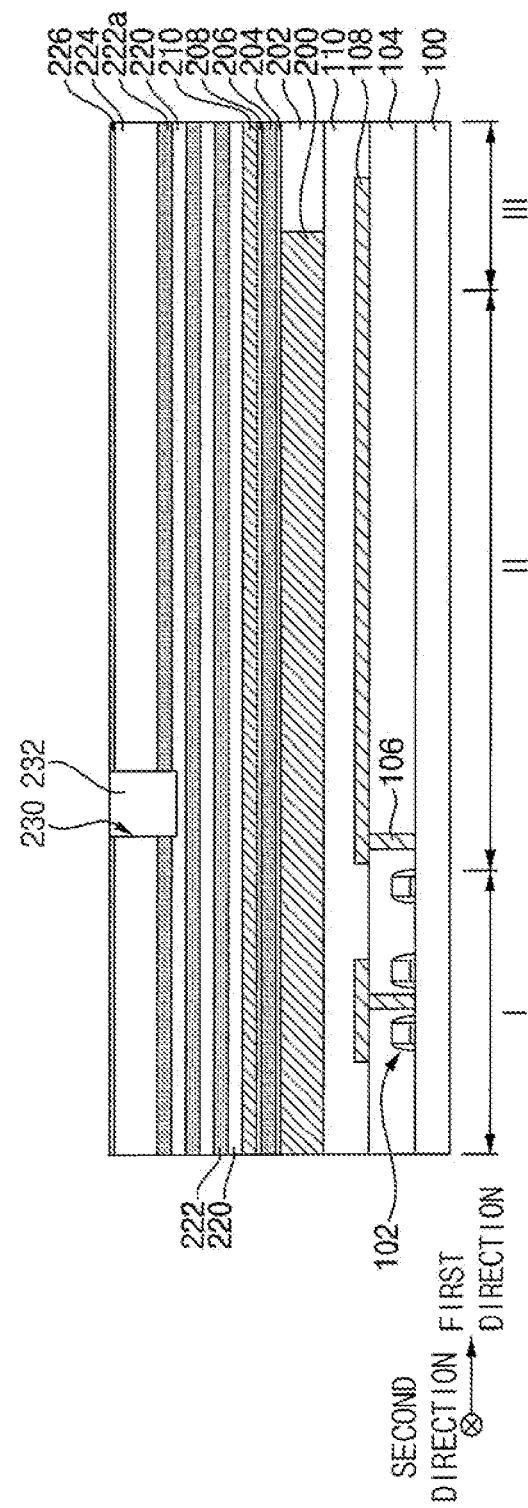

FIGS. 26 to 28 are cross-sectional views of stages in a method of manufacturing a NAND flash memory device in accordance with example embodiments.

The method of manufacturing a NAND flash memory device may include the method of manufacturing a NAND flash memory device the semiconductor device illustrated with reference to FIGS. 5 to 25. Processes described below may further include additional processes during the process described with reference to FIGS. 5 to 25.

Referring to FIG. 26, first, processes illustrated with reference to FIGS. 6 to 9 may be performed.

Thereafter, a second photoresist layer may be formed on the insulation layer 231, and the second photoresist layer may be patterned to form a second photoresist pattern 350. The second photoresist pattern 350 may only cover a portion facing the third opening 230.

Referring to FIG. 27, the insulation layer 231 may be etched using the second photoresist pattern 350 as an etching mask to form a preliminary lower insulation pattern 231a.

In an implementation, the insulation layer 231 may be etched so as to expose the polishing stop layer 226. In an implementation, only a portion of the insulation layer 231 may be partially etched so as not to expose the polishing stop layer 226. In advance, a portion of the insulation layer 231 may be removed by the etching process. Therefore, a polishing amount of the insulation layer 231 in a subsequent process may be decreased.

Referring to FIG. 28, an upper portion of the preliminary lower insulation pattern 231a may be removed by a polishing process to form a lower insulation pattern 232. The polishing process may include a CMP process. By performing the above process, the same structure as shown in FIG. 10 may be formed.

Thereafter, the same processes as illustrated with reference to FIGS. 11 to 25 may be performed so that a NAND flash memory device as shown in FIG. 25 may be manufactured.

The NAND flash memory device manufactured by the above processes may have following structural characteristics.

Figure 30:
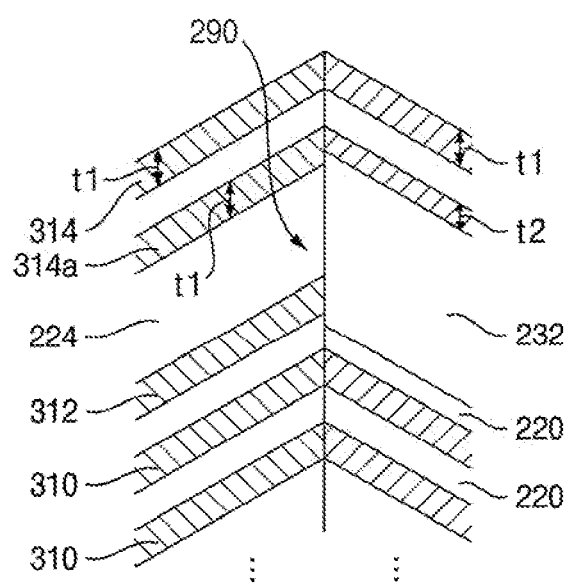

FIGS. 29 and 30 are an enlarged cross-sectional view and an enlarged cut-out perspective view of a cutting portion of a ground selection line and a portion of a first word line in the NAND flash memory device.

Referring to FIGS. 24, 25, 29, and 30, circuit patterns constituting peripheral circuits may be formed on a substrate 100 including first to third regions I, II, and III. In an implementation, the circuit patterns may include lower transistors 102 and lower wirings 106. The lower wiring 106 may include lower contact plugs and lower conductive patterns. The lower wiring 106 may be electrically connected to the lower transistors 102.

A first lower insulating interlayer 104 may be formed on the substrate 100 to cover the circuit patterns, and a lower pad pattern 108 may be formed on the first lower insulating interlayer 104. A second lower insulating interlayer 110 may be formed on the first lower insulating interlayer 104 and the lower pad pattern 108. An upper surface of the second lower insulating interlayer 110 may be substantially flat.

Base semiconductor patterns 200 may be formed on the second lower insulating interlayer 110. A first opening 201 may be formed between the base semiconductor patterns 200. A lower filling pattern 202 may be formed in the first opening 201.

A cell stacked structure 320 may be formed on the base semiconductor pattern 200 on the first and second regions I and II.

In an implementation, the cell stacked structure 320 may have a structure in which a first cell stacked structure and a second cell stacked structure are stacked in the vertical direction. The cell stacked structure 320 may have a structure in which insulation layers 204, 220, 240, 262 and gate patterns 310, 312, 314a, 314 are alternately and repeatedly stacked.

The cell stacked structure 320 may extend in the first direction, and an edge portion in the first direction of the cell stacked structure 320 may have a staircase shape. In an implementation, the cell stacked structure 320 in the pad region may have the staircase shape. In an implementation, the cell stacked structure 320 in the pad region may have steps in each of the first direction and the second direction.

The gate patterns 310, 312, 314a, and 314 of the cell stacked structure 320 may serve as gate patterns of an erase control transistor, a ground selection transistor, cell transistors, and a string select transistor, respectively. The gate patterns of the cell transistors may serve as word lines 314a and 314.

A gate of the ground selection transistor of the cell stacked structure 320 may serve as a ground selection line 312. A gate 310 of the erase control transistor may be formed below the ground selection line. The word lines 314a and 314 and gates of the string selection transistor (e.g., string selection line) may be formed above the ground selection line 312. The ground selection line 312 may have a cutting portion (e.g., may be cut or separated) at the second region II, and the cutting portion 230 of the ground selection line may overlap a portion of a word line cutting region.

A plurality of cell stacked structures 320 may be spaced apart from each other in the second direction. In an implementation, first and second trenches 290 and 292 extending in the first direction may be formed between the cell stacked structures 320.

The cell stacked structures 320 on the first region I may be separated from each other in the second direction by the first and second trenches 290 and 292. The first and second trenches 290 and 292 may be formed in the word line cutting region.

On the second region II, a plurality of first trenches 290 may be spaced apart from each other in the first direction. On the second region II, the first trenches 290 may be arranged in the first direction. The cell stacked structure 320 may have a connected shape without separating in the second direction at a portion in which the first trench 290 is not formed. The connection portion in which the first trench 290 is not formed may overlap the cutting portion 230 of the ground selection line. In an implementation, the cutting portion 230 may be under the connection portion. The second trench 292 may extend from the first region I to the second region II.

In an implementation, the gates 310 of the first and second erase control transistors and ground selection lines 312 may be sequentially disposed at a lower portion of the cell stacked structure 320. In addition, a first insulation layer 220 may be formed between the gates 310 of the first and second erase control transistors and the ground selection line 312.

An uppermost first insulation layer 224 may be formed on the ground selection line 312. The uppermost first insulation layer 224 may have a thickness (in the vertical direction) greater than a thickness (in the vertical direction) of the first insulation layer 220 under (e.g., closer or proximate to the substrate 100 in the vertical direction than) the uppermost first insulation layer 224. In an implementation, the uppermost first insulation layer 224 may have the thickness of 2 times to 5 times the thickness of the first insulation layer 220 thereunder.

A lower insulation pattern 232 may pass through the uppermost first insulation layer 224 and the cutting portion 230 of the ground selection line. The lower insulation pattern 232 may fill the third opening 230 at or in the uppermost first insulation layer 224 and the cutting portion of the ground selection line.

An upper surface of the lower insulation pattern 232 may protrude from an upper surface of the uppermost first insulation layer 224 (e.g., in the vertical direction). A vertical height of the lower insulation pattern 232 protruding from the uppermost first insulation layer 224 may be lower than a first height (which is a target height of the second word line 314 excluding the first word line 314a). The upper surface (e.g., surface facing away from the substrate 100 in the vertical direction) of the lower insulation pattern 232 may be substantially flat.

The lower insulation pattern 232 may include silicon oxide.

The first word line 314a may be on the uppermost first insulation layer 224 and the lower insulation pattern 232. A shape of the first word line 314a may be different from a shape of the second word line 314 thereon.

In an implementation, a portion of the first word line 314a on (e.g., overlying or directly contacting) the uppermost first insulation layer 224 (e.g., laterally offset from the lower insulation pattern 232) may have a first thickness t1, which is a target thickness of the second word line. A portion of first word line 314a on (e.g., overlying or directly contacting) the lower insulation pattern 232 may have a second thickness t2 less than the first thickness t1 (e.g., as measured in the vertical direction).

In an implementation, in the first word line 314a, a first portion not facing (e.g., at sides of) the cutting portion of the ground line may have the first thickness t1, and a second portion facing (e.g., overlying) the cutting portion may have a second thickness t2 less than the first thickness t1. The upper surface of the lower insulation pattern 232 may protrude from a lower surface of the first word line 314a positioned at the first portion. In an implementation, the second portion of the first word line 314a may be inwardly recessed such that the lower insulation pattern 232 may protrude thereinto (e.g., may protrude vertically into the first word line 314a such that a top surface of the lower insulation pattern 232 may be higher than a bottom surface of the first portion of the first word line 314a).

An upper surface of the first word line 314a may be substantially flat. The lower surface of the first word line 314a may have a step difference on the lower insulation pattern 232 (e.g., may not be flat, due to the recess therein). In an implementation, the bottom side of the first word line 314a may have a recess that is complementary to the portion of the lower insulation pattern 232 protruding thereinto.

The second word line 314 (excluding the first word line 314a) may have the first thickness t1, and upper and lower surfaces of the second word lines 314 may both be substantially flat.

Cell stacked structures 320 may be at both sides of the first trench 290, and two cell stacked structures 320 may be connected at a connection portion where the first trench 290 is not formed. In this case, the ground selection lines 312 included in the two cell stacked structures 320 may not be connected, and the ground selection lines 312 may have a cutting portion. The gates 310 of the first and second erase control transistors, the first and second word lines 314a and 314, and the string selection lines included in the cell stacked structure 320 may be connected to each other at the connection portion between the first trenches 290.

As described above, in the cell stacked structure 320, even if the cutting portion 230 of the ground selection line is included, upper surfaces of the first and second word lines 314a and 314 and the string selection lines above the ground selection line may be substantially flat. Thus, structural defects and reliability failure caused by uneven upper surfaces of the first and second word lines 314a and 314 and the string selection lines may be decreased.

Figure 31:
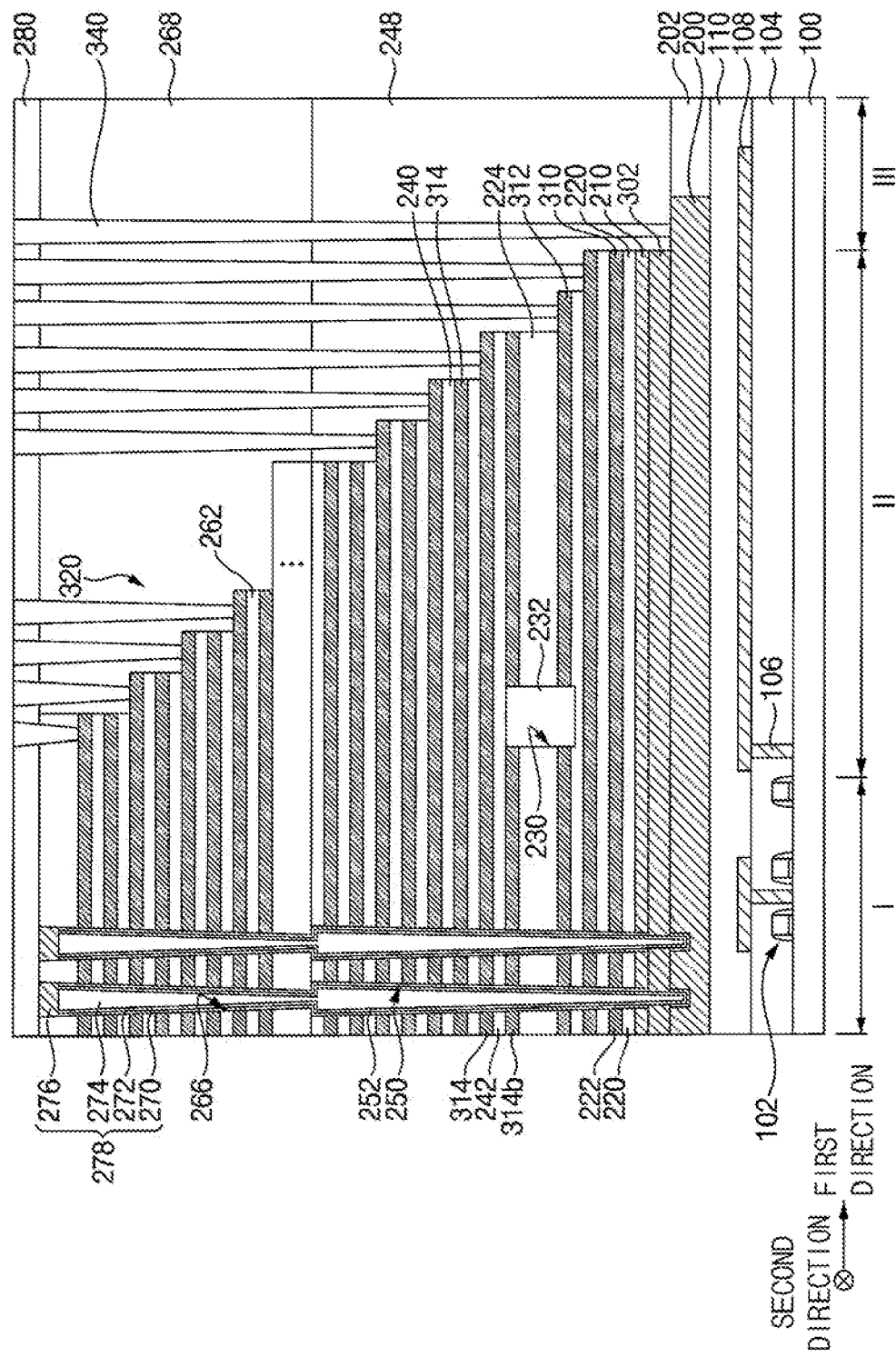
FIG. 31 is a cross-sectional view of a NAND flash memory device in accordance with example embodiments.

FIG. 31 is a cross-sectional view of a NAND flash memory device in accordance with example embodiments.

The NAND flash memory device may be substantially the same as the NAND flash memory device shown in FIG. 25, except for a shape of the first word line. Therefore, redundant descriptions may be omitted.

Referring to FIG. 31, the uppermost first insulation layer 224 may be formed on the ground selection line 312.

The lower insulation pattern 232 may pass through the uppermost first insulation layer 224 and the cutting portion 230 of the ground selection line. The lower insulation pattern 232 may fill the third opening 230 at the uppermost first insulation layer 224 and the cutting portion of the ground selection line.

An upper surface of the lower insulation pattern 232 may protrude from or above an upper surface of the uppermost first insulation layer 224. A vertical height of the lower insulation pattern 232 protruding from the uppermost first insulation layer 224 may be substantially the same as a first height t1 which is a target height of the second word line 314. The upper surface of the lower insulation pattern 232 may be substantially flat.

The first word line 314b may be on the uppermost first insulation layer 224. The first word line 314b may contact a sidewall of the lower insulation pattern 232. In an implementation, the first word line 314b may also be cut by the lower insulation pattern 232. Upper surfaces of the first word line 314b and the lower insulation pattern 232 may be coplanar with each other, and the upper surfaces of the first word line 314*b* and the lower insulation pattern 232 may be substantially flat. The first word line 314*b* may have a first thickness which is a target thickness of the second word line 314.

The first word line 314*b* may have a cutting portion at the third opening 230. Thus, the first word line 314*b* may serve as a dummy word line that is not used for an actual operation.

The second word line 314 (excluding the first word line 314*b*) may have the first thickness, and upper and lower surfaces of the second word lines 314 may be substantially flat.

In an implementation, the NAND flash memory device in accordance with the above-described embodiments may include the first word line having the shape shown in FIG. 31.

Figure 32:
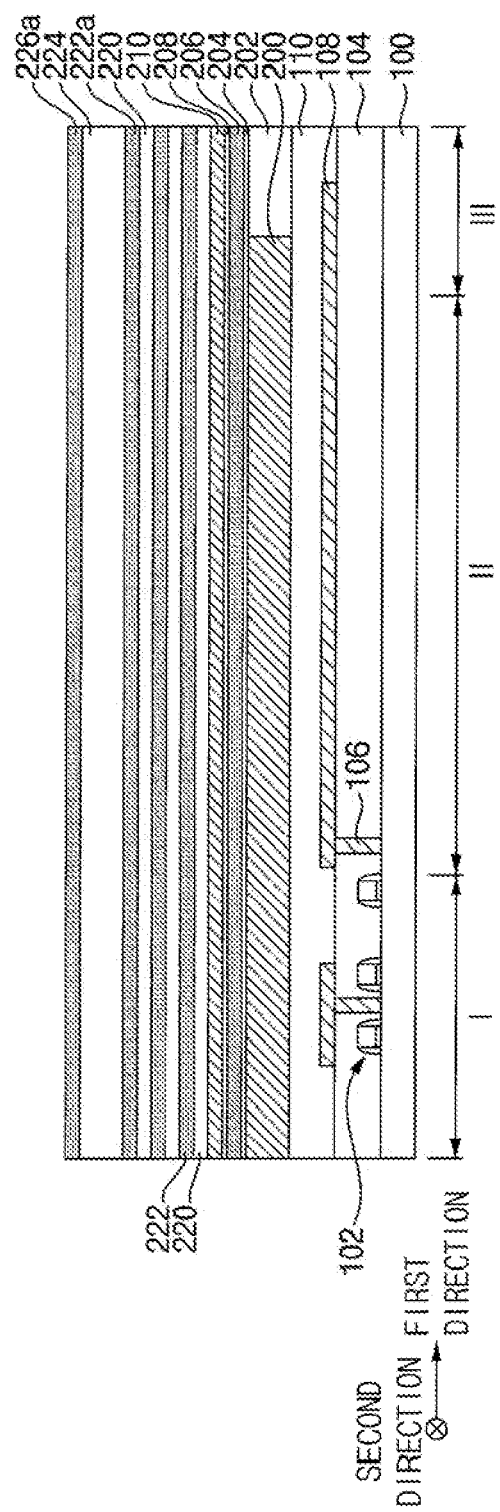
FIGS. 32 to 34 are cross-sectional views of stages in a method of manufacturing a NAND flash memory device in accordance with some example embodiments.
Figure 33:
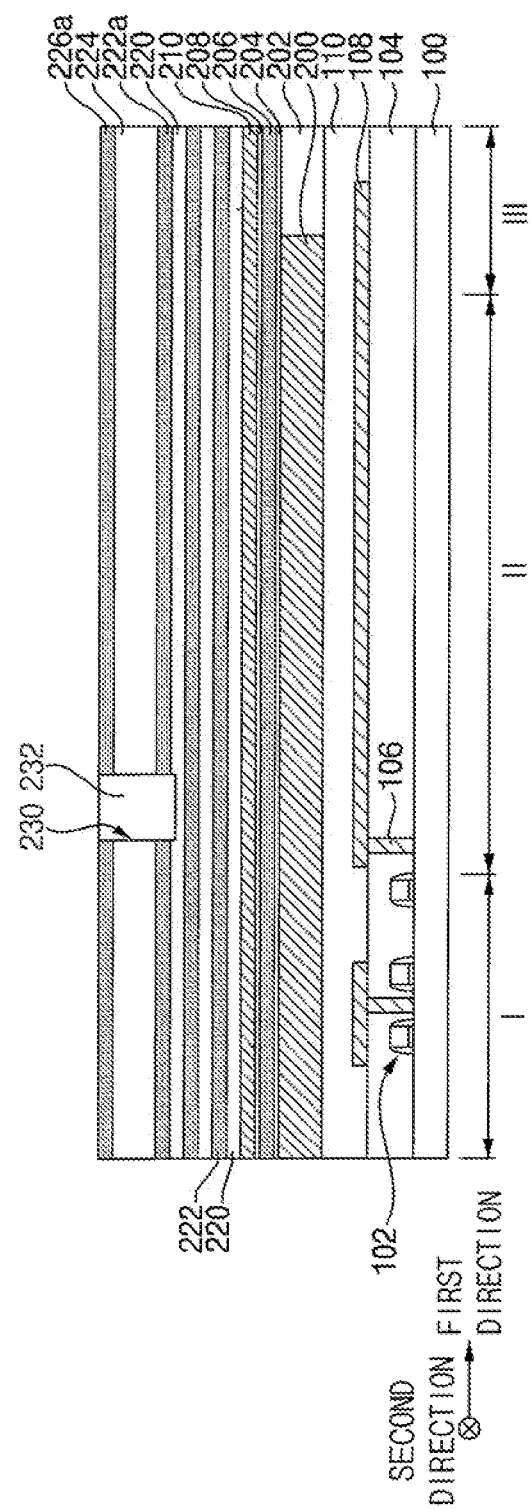
Figure 34:
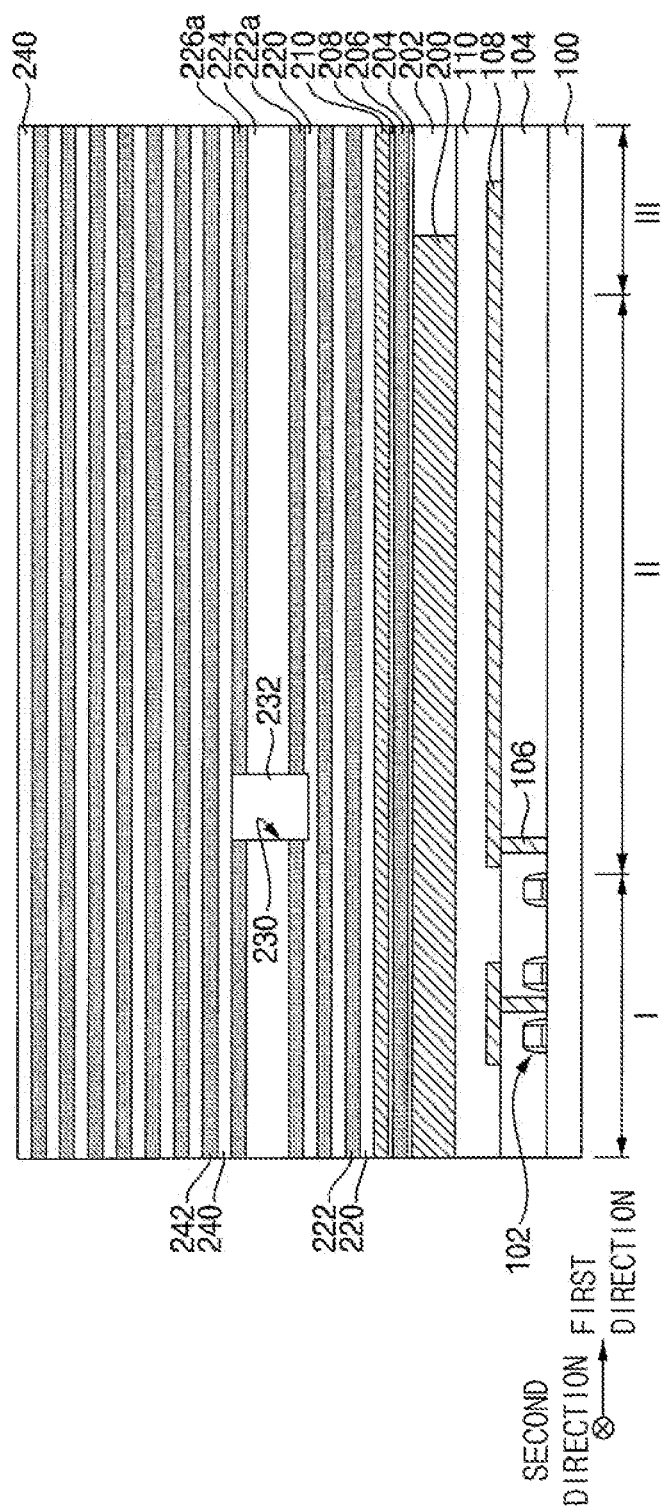

FIGS. 32 to 34 are cross-sectional views of stages in a method of manufacturing a NAND flash memory device in accordance with some example embodiments.

The method of manufacturing the NAND flash memory device may include processes similar to or the same as those illustrated with reference to FIGS. 5 to 25.

Referring to FIG. 32, the same processes as illustrated with reference to FIGS. 5 and 6 may be performed. In an implementation, the polishing stop layer 226*a* may be formed to have the first thickness which is the target thickness of the second word line.

Referring to FIG. 33, the same processes as described with reference to FIGS. 7 to 10 may be performed. When the above processes are performed, the upper surface of the lower insulation pattern 232 may protrude from or above the upper surface of the first insulation layer 220 (e.g., the uppermost first insulation layer 224) by the first thickness.

Referring to FIG. 34, second insulation layers 240 and third sacrificial layers 242 may be alternately and repeatedly formed on the polishing stop layer 226. The third sacrificial layer 242 may have the first thickness which is the target thickness of the second word line 314.

In an implementation, an additional sacrificial layer (e.g., the second sacrificial layer of FIG. 12) may not be formed on the polishing stop layer 226. The polishing stop layer 226 may be replaced with the first word line 314*b* by subsequent processes, so that the first word line 314*b* may have a cutting shape (e.g., may be cut or separated) by the lower insulation pattern 232.

Thereafter, the same processes illustrated with reference to FIGS. 14 to 25 may be performed, so that a NAND flash memory device as shown in FIG. 31 may be manufactured.

NAND flash memory devices of various structures including the first word line as illustrated above may be presented, and may be briefly described below.

Figure 35:
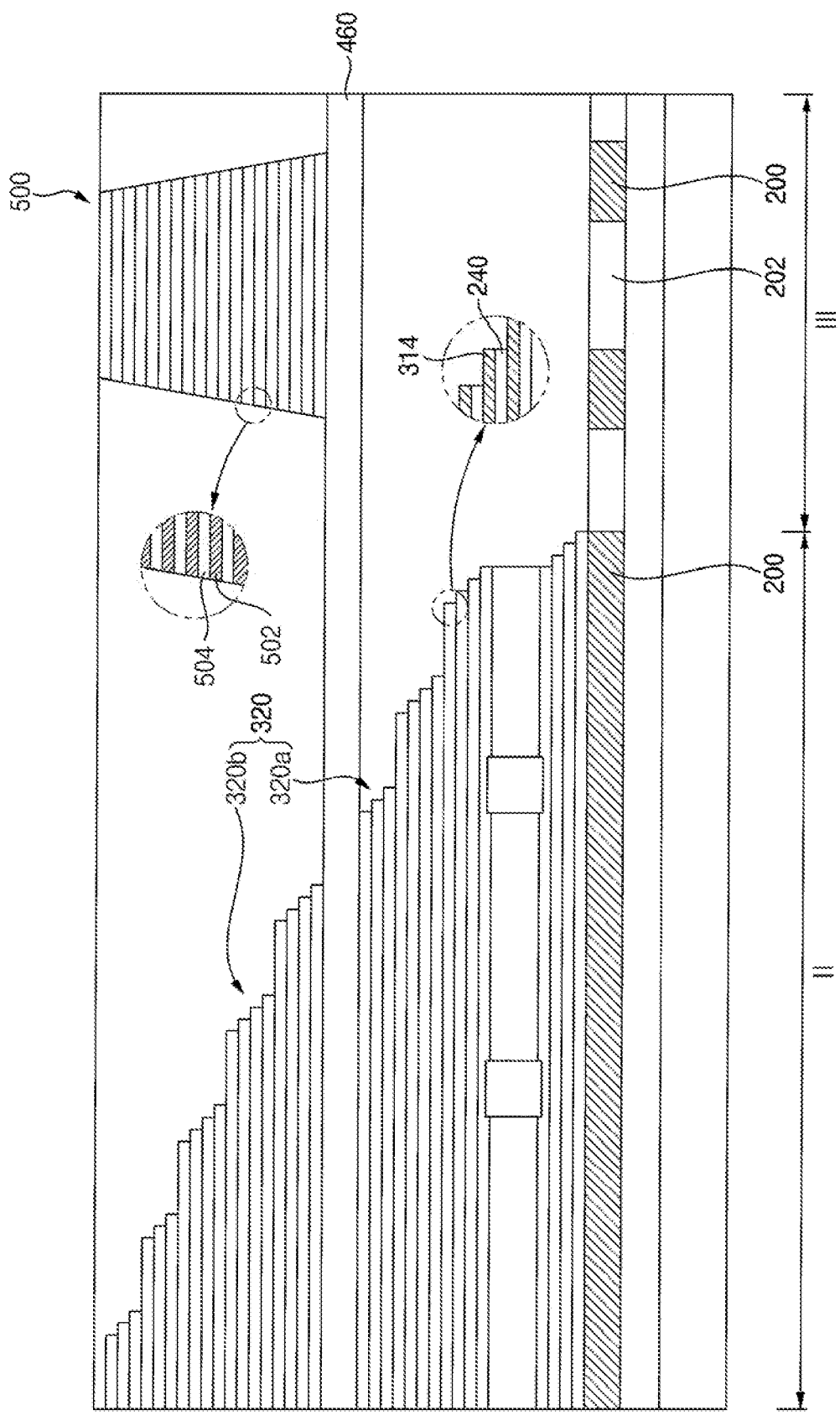
FIG. 35 is a cross-sectional view of a NAND flash memory device in accordance with example embodiments.

FIG. 35 is a cross-sectional view of a NAND flash memory device in accordance with example embodiments.

The NAND flash memory device shown in FIG. 35 may have substantially the same structure as the NAND flash memory device shown in FIG. 25 except that a dummy structure may be further included on the third region.

Referring to FIGS. 35 and 25, the ground selection line 312 may extend in the first direction. A plurality of ground selection lines may be spaced apart from each other in the second direction. Cutting portions of the ground selection lines may be positioned between the ground selection lines 312 in the second direction. The cutting portions of the ground selection lines may be arranged to parallel in the first direction.

The cell stacked structures and structures below the cell stacked structures in the first and second regions may be substantially the same as those shown in FIG. 25, and thus may be simply shown or omitted. In FIG. 35, a step layer in which an insulation layer and a conductive pattern are stacked is illustrated as one step layer. As shown in the enlarged portion, the step layer may include, e.g., the second insulation layer 240 and the second word line 314 stacked.

The cell stacked structure 320 may have a structure in which the first cell stacked structure 320*a* and the second cell stacked structure 320*b* are stacked. In an implementation, a buffer insulation layer 460 may be further formed between the first cell stacked structure 320*a* and the second cell stacked structure 320*b*.

A dummy structure 500 may be on the third region III.

In an implementation, the dummy structure 500 may be on the buffer insulation layer 460. The dummy structure 500 may be at the same level as the second cell stacked structure 320*b*. As shown in the enlarged portion, the dummy structure 500 may include insulation layers 502 and sacrificial layers 504 alternately stacked.

The dummy structure 500 may be formed together in processes for forming a second cell mold structure on the first and second regions I and II. In an implementation, in the dummy structure 500, the sacrificial layer may not be replaced with a conductive material in a subsequent metal replacement process. Thus, the insulation layers 502 and sacrificial layers 504 included in the dummy structure 500 may remain after the metal replacement process.

In an implementation, the first word line may have the same structure as in FIG. 25. In an implementation, the first word line may have the same structure as in FIG. 31.

In an implementation, a through via contact may be further formed through the dummy structure 500. The through via contact may be electrically connected to the lower pad pattern.

Figure 36:
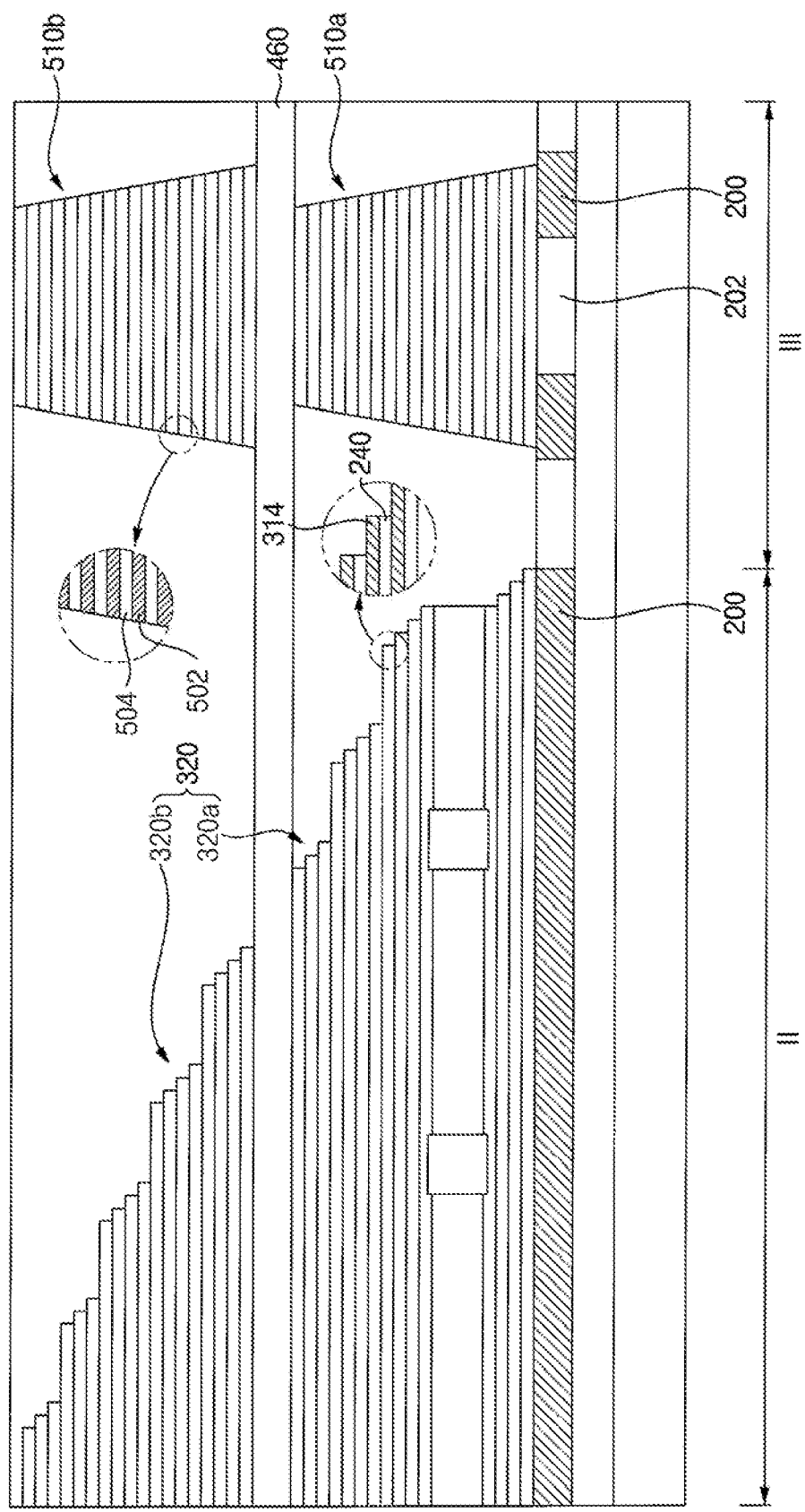
FIG. 36 is a cross-sectional view of a NAND flash memory device in accordance with example embodiments.

FIG. 36 is a cross-sectional view of a NAND flash memory device in accordance with example embodiments.

The NAND flash memory device substantially the same as the NAND flash memory device shown in FIG. 35, except for a shape of a dummy structure on the third region III.

Referring to FIG. 36, the dummy structure may include a first dummy structure 510*a* and a second dummy structure 510*b*.

The first dummy structure 510*a* may be on the base semiconductor pattern 200 and the lower filling pattern 202 on the third region III. The first dummy structure 510*a* may be at the same level as the first cell stacked structure 320*a*. The second dummy structure 510*b* may be on the buffer insulation layer 460. The second dummy structure 510*b* may be at the same level as the second cell stacked structure 320*b*. As shown in the enlarged portion, the first and second dummy structures 510*a* and 510*b* may include insulation layers 502 and sacrificial layers 504 alternately stacked.

The first dummy structure 510*a* may be formed together in a process for forming the first cell mold structure on the first and second regions I and II. In an implementation, the second dummy structure 510*b* may be formed together in a process for forming the second cell mold structure on the first and second regions I and II. In an implementation, in the first and second dummy structures 510*a* and 510*b*, the sacrificial layers 504 may not be replaced with a conductive material in a subsequent metal replacement process. Thus, the insulation layers 502 and sacrificial layers 504 included in the first and second dummy structures 510*a* and 510*b* may remain after the metal replacement process.

In an implementation, the first word line may have the same structure as in FIG. 25. In an implementation, the first word line may have the same structure as in FIG. 31.

In an implementation, a through via contact may be further formed through the first and second dummy structures 510a and 510b. The through via contact may be electrically connected to the lower pad pattern.

Figure 37:
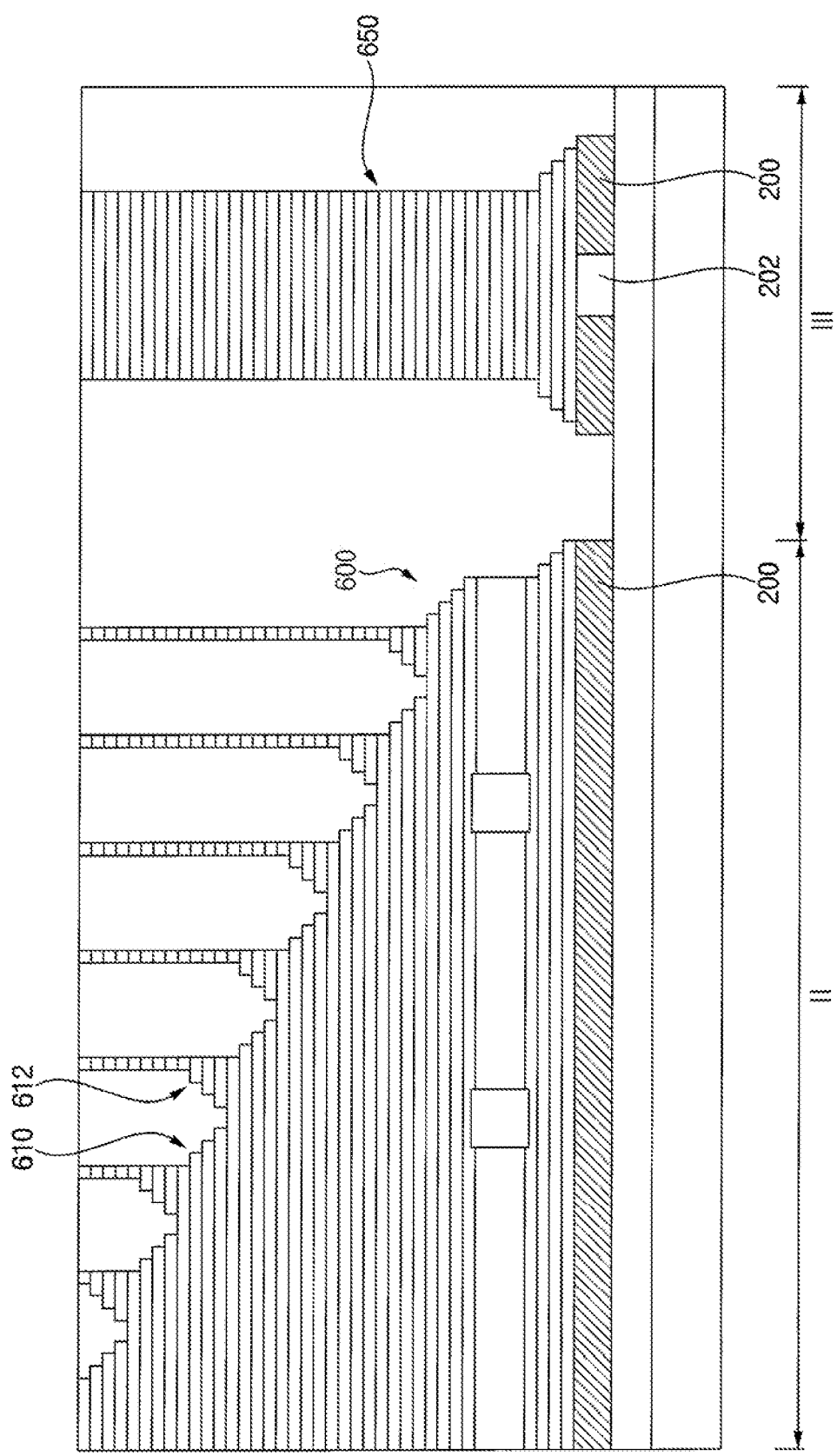
FIG. 37 is a cross-sectional view of a NAND flash memory device in accordance with example embodiments.

FIG. 37 is a cross-sectional view of a NAND flash memory device in accordance with example embodiments.

The NAND flash memory device shown in FIG. 37 may have substantially the same structure as the NAND flash memory device shown in FIG. 35 except for a shape of a step portion on the second region II and a shape of the dummy structure on the third region III.

Referring to FIG. 37, step portions of the cell stacked structure 600 may include a first step portion 610 used as an actual gate pad and a second step portion 612 not used as an actual gate pad.

In an implementation, the first step portion 610 may be connected to a string selection line, word lines, and a ground selection line. The second step portion 612 may face the first step portion 610 in the first direction. The second step portion 612 may not be connected to the string selection line, the word lines, and the ground selection line.

The second step portion 612 may include a first sidewall facing the first step portion 610 and a second sidewall opposite to the first sidewall. The first sidewall of the second step portion may include steps and a vertical slope. Steps of the first step portions 610 and steps of the second step portions 612 may be symmetrical to each other. The second sidewall of the second step portion 612 may have the vertical slope. The second step portion 612 may serve as a pad dummy structure. An upper surface of the pad dummy structure may be coplanar with an uppermost surface of the cell stacked structure 600 in the first region I.

The dummy structure 650 may be on the base semiconductor pattern 200 and the lower filling pattern 202 in the third region III. An upper surface of the dummy structure 650 may be coplanar with the uppermost surface of the cell stacked structure 600 in the first region I. In an implementation, a lower sidewall of the dummy structure 650 may have a staircase shape. The lower sidewall of the dummy structure 650 may have steps, and an upper sidewall on the steps may have a vertical slope.

In an implementation, the first word line may have the same structure as in FIG. 25. In an implementation, the first word line may have the same structure as in FIG. 31.

In an implementation, a through via contact may be further formed through the dummy structure 650. The through via contact may be electrically connected to the lower pad pattern.

Figure 38:
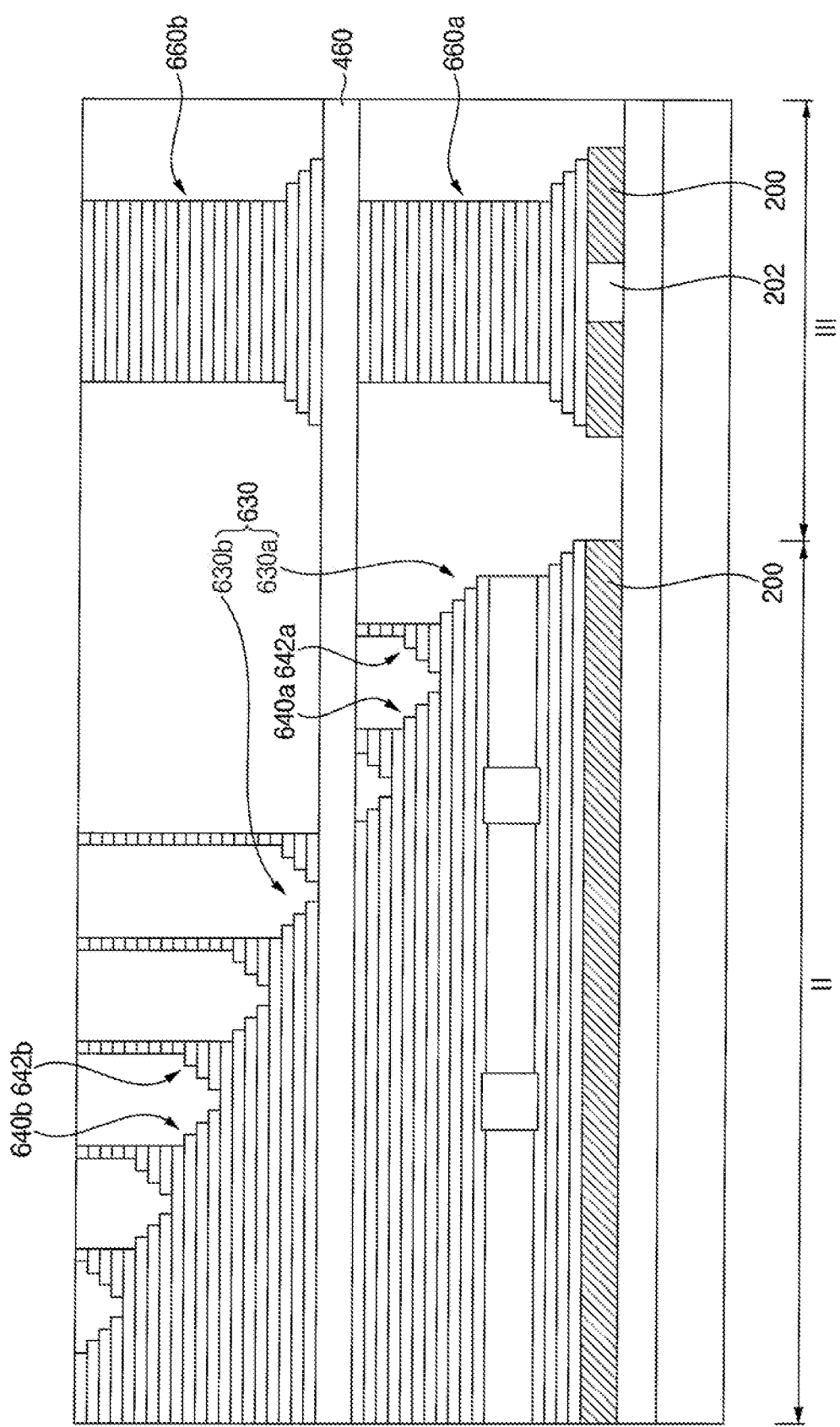
FIG. 38 is a cross-sectional view of a NAND flash memory device in accordance with example embodiments.

FIG. 38 is a cross-sectional view of a NAND flash memory device in accordance with example embodiments.

The NAND flash memory device substantially the same as the NAND flash memory device shown in FIG. 37, except for a shape of a step portion on the second region II and a shape of the dummy structure on the third region III.

Referring to FIG. 38, the cell stacked structure 630 may have a structure in which a first cell stacked structure 630a and a second cell stacked structure 630b are stacked. In an implementation, a buffer insulation layer 460 may be further formed between the first cell stacked structure 630a and the second cell stacked structure 630b.

The step portions of the cell stacked structure 630 may include first and second step portions 640a and 640b used as actual gate pads and third and fourth step portions 642a and 642b not used as actual gate pads.

In an implementation, the first and second step portions 640a and 640b may be connected to string selection lines, word lines, and ground selection lines. The third and fourth step portions 642a and 642b may not be connected to the string selection line, the word lines, and the ground selection line.

A portion of the third step portion 642a may be symmetrical with the first step portion 640a. In an implementation, steps of the first step portions 640a and steps of the third step portions 642a may be symmetrical to each other. A first sidewall of the third step portion 642a may have a staircase shape, and a second sidewall opposite to the first sidewall may have a vertical slope. The third step portion 642a may serve as a first pad dummy structure. An upper surface of the first pad dummy structure may be coplanar with an upper surface of the first cell stacked structure 630a in the first region I.

A portion of the fourth step portion 642b may be symmetrical with the second step portion 640b. In an implementation, steps of the second step portions 640b and steps of the fourth step portions 642b may be symmetrical to each other. A first sidewall of the second step portion 640b may have a staircase shape, and a second sidewall opposite to the first sidewall may have a vertical slope. The fourth step portion 642b may serve as a second pad dummy structure. An upper surface of the second pad dummy structure may be coplanar with an upper surface of the second cell stacked structure 630b on the first region I.

The dummy structure may include a first dummy structure 660a and a second dummy structure 660b. The first dummy structure 660a may be at the same level as the first cell stacked structure 630a. The second dummy structure 660b may be on the buffer insulation layer 460. The second dummy structure 660b may be at the same level as the second cell stacked structure 630b. The first and second dummy structures 660a and 660b may include insulation layers 502 and sacrificial layers 504 alternately stacked.

A lower sidewall of each of the first and second dummy structures 660a and 660b may have a staircase shape. The lower sidewall of each of the first and second dummy structures 660a and 660b may have steps, and an upper sidewall disposed on the steps may have a vertical slope.

In an implementation, the first word line may have the same structure as in FIG. 25. In an implementation, the first word line may have the same structure as in FIG. 31.

In an implementation, a through via contact may be further formed through the dummy structure 650. The through via contact may be electrically connected to the lower pad pattern.

By way of summation and review, as a stacking height of memory cells in the vertical non-volatile memory device increases, there may be issues forming a memory cell structure having a stable structure.

One or more embodiments may provide a memory device having a stable structure.

In example embodiments, the memory device may include the first word line immediately above the ground selection line. The first word line may have the first thickness at the first portion not facing (e.g., around) the cutting portion of the ground selection line, and the first word line may have the second thickness (less than the first thickness) at the second portion facing (e.g., overlying or aligned with) the cutting portion. The upper surface of the first word line may be substantially flat. Thus, the upper and lower surfaces of the second word lines formed on the first word line may also be substantially flat. Therefore, defects caused by uneven upper and lower surfaces of word lines at the cutting portion of the ground selection line may be reduced.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A memory device, comprising:
   a substrate;
   a first insulation layer on the substrate:
   a ground selection line on the first insulation layer, a cutting portion cutting the ground selection line;
   an uppermost first insulation layer and a first word line stacked immediately above the ground selection line; and
   second insulation layers and second word lines alternately stacked on the first word line,
   wherein:
   the first word line includes a first portion laterally offset from the cutting portion and a second portion overlying the cutting portion,
   the first portion of the first word line has a first thickness,
   the second portion of the first word line has a second thickness less than the first thickness,
   each of the second word lines has the first thickness,
   the cutting portion includes an opening passing through the uppermost first insulation layer, cutting the ground selection line, and extending into a portion of the first insulation layer,
   a lower insulation pattern is in the opening, and
   the uppermost first insulation layer has a thickness that is about 2 times to about 5 times a thickness of the first insulation layer.

2. The memory device as claimed in claim 1, wherein an upper surface of the lower insulation pattern protrudes above a lower surface of the first word line at the first portion of the first word line.

3. The memory device as claimed in claim 1, wherein the lower insulation pattern includes silicon oxide.

4. The memory device as claimed in claim 1, wherein: an upper surface of the first word line is flat at the first portion and the second portion, and
   a lower surface of the second portion of the first word line is inwardly recessed relative to a lower surface of the first portion of the first word line such that a lower surface of the first word line is not flat.

5. The memory device as claimed in claim 1, wherein upper surfaces of the second word lines are flat and lower surfaces of the second word lines are flat.

6. The memory device as claimed in claim 1, wherein the thickness of the uppermost first insulation layer is greater than a thickness of the second insulation layer.

7. The memory device as claimed in claim 1, further comprising:
   a circuit pattern on the substrate; and
   a base semiconductor pattern on the circuit pattern,
   wherein the ground selection line is on the base semiconductor pattern.

8. A memory device, comprising:
   a substrate;
   a circuit pattern on the substrate;
   a base semiconductor pattern on the circuit pattern;
   a first insulation layer on the base semiconductor pattern;
   a ground selection line on the first insulation layer, a cutting portion cutting the ground selection line;
   an uppermost first insulation layer and a first word line stacked immediately above the ground selection line;
   a lower insulation pattern passing through a portion of the uppermost first insulation layer, the first insulation layer, and the cutting portion;
   second insulation layers and second word lines alternately stacked on the first word line; and
   a channel structure passing through the ground selection line, the uppermost first insulation layer, the first word line, the second insulation layers, and the second word lines, the channel structure extending in a vertical direction,
   wherein:
   the first word line includes a first portion laterally offset from the cutting portion and a second portion overlying the cutting portion,
   the first portion of the first word line has a first thickness,
   the second portion of the first word line has a second thickness less than the first thickness,
   an upper surface of the lower insulation pattern protrudes above a lower surface of the first word line at the first portion of the first word line,
   each of the second word lines has the first thickness, and
   the uppermost first insulation layer has a thickness that is about 2 times to about 5 times a thickness of the first insulation layer.

9. The memory device as claimed in claim 8, wherein:
   an upper surface of the first word line is flat at the first portion and the second portion, and
   a lower surface of the second portion of the first word line is inwardly recessed relative to a lower surface of the first portion of the first word line such that a lower surface of the first word line is not flat.

10. The memory device as claimed in claim 8, wherein upper and lower surfaces of the second word lines are flat.

11. The memory device as claimed in claim 8, further comprising a gate pattern of an erase control transistor below the ground selection line on the base semiconductor pattern.

12. The memory device as claimed in claim 8, wherein the lower insulation pattern includes silicon oxide.

13. The memory device as claimed in claim 8, wherein:
   the ground selection line, the uppermost first insulation layer, the first word line, the second insulation layers, and the second word lines stacked in the vertical direction constitute a cell stacked structure, and
   each of a plurality of the cell stacked structures extend in a first direction.

14. The memory device as claimed in claim 13, further comprising trenches extending in the first direction between the cell stacked structures and a connection portion between the trenches, wherein the cutting portion is under the connection portion.

15. An electronic system, comprising:
   a memory device; and
   a controller configured to control the memory device, the controller being electrically connected to the memory device through an input/output pad of the memory device,
   wherein the memory device includes:
   a substrate;
   a peripheral circuit pattern on the substrate;
   a first insulation layer on the peripheral circuit pattern;

a ground selection line on the first insulation layer, a cutting portion cutting the ground selection line;

an uppermost first insulation layer and a first word line stacked immediately above the ground selection line;

second insulation layers and second word lines alternately stacked on the first word line; and the input/output pad, the input/output pad being electrically connected to the peripheral circuit pattern, wherein the first word line includes a first portion laterally offset from the cutting portion and a second portion overlying the cutting portion, wherein the first portion of the first word line has a first thickness, wherein the second portion of the first word line has a second thickness less than the first thickness, wherein each of the second word lines has the first thickness, wherein the cutting portion includes an opening passing through the uppermost first insulation layer, cutting the ground selection line, and extending into a portion of the first insulation layer, wherein a lower insulation pattern fills the opening, the lower insulation pattern having an upper surface protruding above a lower surface of the first word line at the first portion of the first word line and having a lower surface protruding below a lower surface of the ground selection line, and the uppermost first insulation layer has a thickness that is about 2 times to about 5 times a thickness of the first insulation layer.

16. The memory device as claimed in claim 1, wherein the substrate includes a first region in which memory cells are formed and a second region surrounding the first region in which contacts for transmitting electrical signals to memory cells are formed, and the cutting portion is disposed in the second region of the substrate.

17. The memory device as claimed in claim 8, wherein the substrate includes a first region in which memory cells are formed and a second region surrounding the first region in which contacts for transmitting electrical signals to memory cells are formed, and the cutting portion is disposed in the second region of the substrate.

\* \* \* \* \*